United States Patent
Hsieh et al.

(10) Patent No.: US 10,855,289 B2
(45) Date of Patent: Dec. 1, 2020

(54) OVEN CONTROLLED CRYSTAL OSCILLATOR

(71) Applicant: TXC CORPORATION, Taipei (TW)

(72) Inventors: Wan-Lin Hsieh, Ping Cheng (TW); Erh-Shuo Hsu, Ping Cheng (TW); Shao-Po Sun, Ping Cheng (TW); Sheng-Hsiang Kao, Ping Cheng (TW); Yu-Shun Yen, Ping Cheng (TW)

(73) Assignee: TXC Corporation, Taipei (TW)

( * ) Notice: Subject to any disclaimer, the term of this patent is extended or adjusted under 35 U.S.C. 154(b) by 0 days.

(21) Appl. No.: 16/676,785

(22) Filed: Nov. 7, 2019

(65) Prior Publication Data

US 2020/0076438 A1 Mar. 5, 2020

Related U.S. Application Data

(63) Continuation-in-part of application No. 16/363,055, filed on Mar. 25, 2019, now Pat. No. 10,511,310, (Continued)

(51) Int. Cl.
*H03L 1/02* (2006.01)
*H03L 1/04* (2006.01)
(Continued)

(52) U.S. Cl.
CPC .............. *H03L 1/028* (2013.01); *G01K 13/00* (2013.01); *H01L 23/345* (2013.01); *H03L 1/02* (2013.01); *H03L 1/04* (2013.01); *H05K 1/0212* (2013.01); *H05K 1/181* (2013.01); *H05K 1/0298* (2013.01); *H05K 1/0306* (2013.01); *H05K 1/184* (2013.01); *H05K 2201/10075* (2013.01); *H05K 2201/10151* (2013.01)

(58) Field of Classification Search
CPC ........... H03B 5/04; H03B 5/32; H01L 41/053; H01L 41/047; H01L 23/498; H01L 23/345; G01K 13/00; H05K 1/181; H05K 1/0212; H05K 1/184; H05K 1/0298; H05K 1/0306; H05K 2201/10075; H05K 2201/10151; H03L 1/028; H03L 1/04; H03L 1/02
USPC ...................... 331/158, 176, 68, 69
See application file for complete search history.

(56) References Cited

U.S. PATENT DOCUMENTS

| | | | |
|---|---|---|---|
| 6,559,728 B1 * | 5/2003 | Fry | H03L 1/04 331/108 D |
| 7,196,405 B1 * | 3/2007 | Ferreiro | H03H 9/0514 257/659 |

(Continued)

*Primary Examiner* — Arnold M Kinkead
(74) *Attorney, Agent, or Firm* — Rosenberg, Klein & Lee

(57) ABSTRACT

An oven controlled crystal oscillator consisting includes a substrate, which includes a substrate, at least one base, a crystal blank, a first cover lid, an IC chip, a heat-insulating adhesive, a heater, and a second cover lid. The top of the base is provided with a cavity, and the top of the base is connected to the substrate through conductive wires without using solder. The crystal blank is mounted in the cavity. The first cover lid seals the cavity. The IC chip is mounted on the bottom of the base. The base is mounted on the substrate through the IC chip and the heat-insulating adhesive, and the IC chip is mounted to the bottom of the base. Alternatively, the IC chip and the base are horizontally arranged. The second cover lid is mounted on the top of the substrate.

25 Claims, 23 Drawing Sheets

Related U.S. Application Data which is a continuation of application No. 15/342,554, filed on Nov. 3, 2016, now Pat. No. 10,291,236.

(60) Provisional application No. 62/308,323, filed on Mar. 15, 2016.

(51) Int. Cl.
| | | |
|---|---|---|
| *G01K 13/00* | (2006.01) | |
| *H01L 23/34* | (2006.01) | |
| *H05K 1/18* | (2006.01) | |
| *H05K 1/02* | (2006.01) | |
| *H05K 1/03* | (2006.01) | |

(56) References Cited

U.S. PATENT DOCUMENTS

2005/0040905 A1* 2/2005 Hatanaka ................ H03L 1/04
331/176
2015/0282322 A1* 10/2015 Kondo ................ H05K 1/0212
361/748

\* cited by examiner

OVEN CONTROLLED CRYSTAL OSCILLATOR

BACKGROUND OF THE INVENTION

Field of the Invention

The present invention relates to a crystal oscillator, particularly to an oven controlled crystal oscillator.

Description of the Related Art

As shown in FIG. 1, the main portion of an oven controlled crystal oscillator is a ceramic carrier substrate 10 that is located in the central region of the whole oven structure. Respectively above and beneath the ceramic carrier substrate 10 are a simple crystal package 12 and an IC chip 14. The IC chip 14 includes a first heater 16, a temperature sensor 18, an oscillator circuit, and a temperature control circuit. The IC chip 14 is coated with an overcoating filling 15. The crystal blank 20 is mounted in the cavity of the simple crystal package 12 and sealed with a metal lid 22. After crystal blank 20 and IC chip 14 assembly, the main ceramic carrier substrate 10 together with the simple crystal package 12 and IC chip 14 is mounted to a PCB substrate 24 by connecting solder 26, combining an exterior cover lid 28 to form an airtight chamber space.

In the oven controlled crystal oscillator, the first heater 16 that is used to maintain the specific working temperature is integrated inside the IC chip 14. Another key element, temperature sensor 18 is also integrated inside the IC chip 14. The crystal blank 20 is heated by the first heater 16 at beneath from the surface of IC chip 14 and through the ceramic carrier substrate 10 and solder 26. The structure is asymmetric with respect to the first heater 16 therefore the temperature difference between crystal blank 20 and IC chip 14 is big, the temperature uniformity of structure is thus not good enough, so it affects the effect of controlling the oven temperature. As shown in FIG. 2, the temperature of the IC chip 14 is very close to that of the first heater 16 when the oven controlled crystal oscillator works at an ambient temperature. The temperature difference between the crystal blank 20 and the IC chip 14 is 4.07° C. when the oven controlled crystal oscillator works at an ambient temperature of −40° C. The temperature difference between the crystal blank 20 and the IC chip 14 is 0.31° C. when the oven controlled crystal oscillator works at an ambient temperature of about 88° C. In other words, the temperature difference between the crystal blank 20 and the IC chip 14 is larger when the oven controlled crystal oscillator works at a lower ambient temperature. This is because the first heater 16 transmits heat from the IC chip 14 to the crystal blank 20 to result in linear temperature gradient between them. The linear temperature gradient can establish an asymmetric thermal field and result in bad thermal uniformity.

To overcome the abovementioned problems, the present invention provides an oven controlled crystal oscillator, so as to solve the afore-mentioned problems of the prior art.

SUMMARY OF THE INVENTION

The primary objective of the present invention is to provide an oven controlled crystal oscillator, which connects an inner base to an external substrate through conductive wires without using solder, mounts an IC chip on the bottom of the base, and installs the IC chip on the substrate through an heat-insulating adhesive, thereby reducing the heat dissipation and power consumption, achieving the good thermal uniformity, and maintaining the oven stability.

To achieve the abovementioned objectives, the present invention provides an oven controlled crystal oscillator, which comprises a substrate, at least one base, a crystal blank, a first cover lid, an integrated circuit (IC) chip, a heat-insulating adhesive, a first heater, and a second cover lid. The top of the base is provided with a first cavity, and the top of the base is connected to the substrate through conductive wires without using solder. The crystal blank is mounted in the first cavity. The first cover lid, mounted on the top of the base, seals the first cavity. The IC chip is mounted on the bottom of the base. The base is mounted on the substrate through the IC chip and the heat-insulating adhesive, the IC chip is connected to the bottom of the base, and the heat-insulating adhesive encapsulates the IC chip. The first heater is combined with one of the base and the IC chip. The second cover lid, mounted on the top of the substrate, covers the base, the conductive wires, the crystal blank, the first cover lid, the IC chip, the heat-insulating adhesive, and the first heater.

The present invention also provides an oven controlled crystal oscillator, which comprises a substrate, a heat-insulating adhesive, a carrier, a base, an integrated circuit (IC) chip, a crystal blank, a first cover lid, a heater, and a second cover lid. The heat-insulating adhesive is mounted on the substrate. The carrier is mounted on the heat-insulating adhesive and connected to the substrate through conductive wires without using solder. The base and the IC chip are mounted on the carrier, the top of the base is provided with a first cavity, and the IC chip is connected to the carrier. The crystal blank is mounted in the first cavity. The first cover lid, mounted on the top of the base, seals the first cavity. The heater is combined with one of the base, the carrier, and the IC chip. The second cover lid, mounted on the top of the substrate, covers the base, the carrier, the conductive wires, the crystal blank, the first cover lid, the IC chip, the heat-insulating adhesive, and the heater.

The present invention further provides an oven controlled crystal oscillator, which comprises a substrate, a heat-insulating adhesive, a base, a crystal blank, an integrated circuit (IC) chip, a first cover lid, a heater, and a second cover lid. The top of the substrate is provided with a first cavity. The heat-insulating adhesive is mounted in the first cavity. The base is mounted on the heat-insulating adhesive, mounted in the first cavity, and connected to the substrate through conductive wires without using solder, and the top of the base is provided with a second cavity. The crystal blank and the IC chip are mounted in the second cavity, and the IC chip is connected to the base. The first cover lid, mounted on the top of the base, seals the second cavity. The heater is embedded in the base. The second cover lid, mounted on the top of the substrate, covers the base, the conductive wires, the crystal blank, the first cover lid, the IC chip, the heat-insulating adhesive, and the heater.

Below, the embodiments are described in detail in cooperation with the drawings to make easily understood the technical contents, characteristics and accomplishments of the present invention.

DETAILED DESCRIPTION OF THE INVENTION

Figure 1:
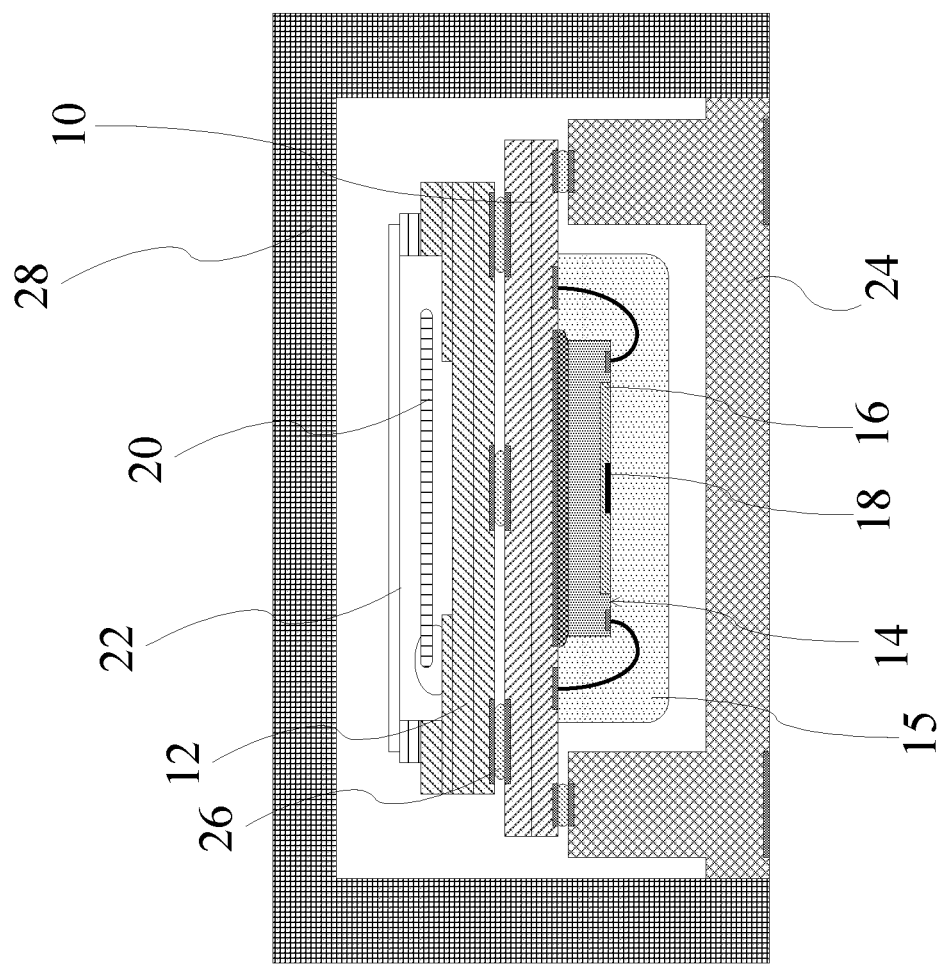
FIG. 1 is a diagram schematically showing an oven controlled crystal oscillator in a conventional technology.
Figure 2:
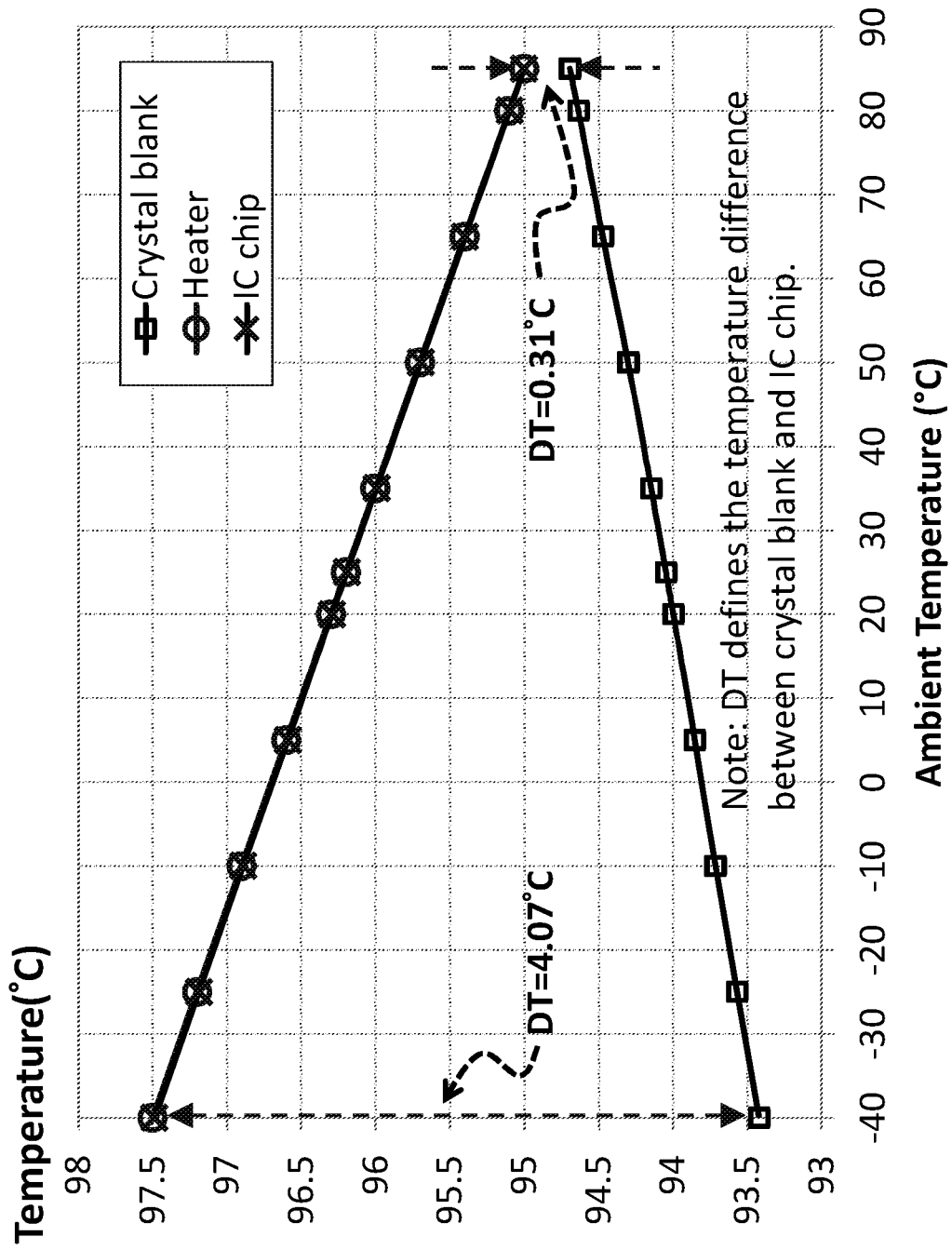
FIG. 2 is a diagram schematically showing thermal gradient in an asymmetric oven controlled crystal oscillator in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Figure 3:
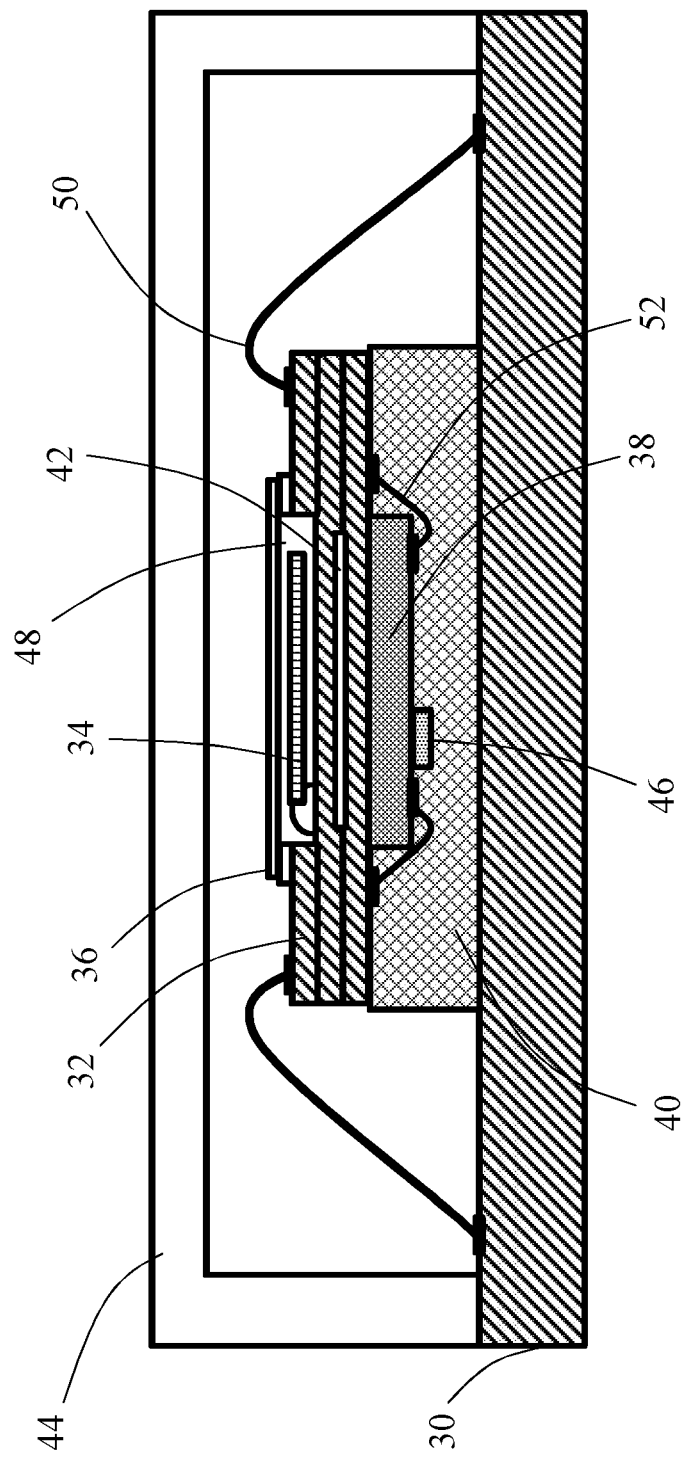
FIG. 3 is a diagram schematically showing an oven controlled crystal oscillator according to the first embodiment of the present invention.

Refer to FIG. 3. The first embodiment of the oven controlled crystal oscillator (OCXO) of the present invention is introduced as below. The OCXO comprises a substrate 30, at least one base 32, a crystal blank 34, a first cover lid 36, an integrated circuit (IC) chip 38, a heat-insulating adhesive 40, a first heater 42, a second cover lid 44, and a temperature sensor 46. In the first embodiment, the number of the base 32 is one. Besides, the substrate 30 may be a ceramic substrate and the base 32 may be a ceramic base. Each of the ceramic substrate and the ceramic base is embedded with conductive traces and conductive vias to electrically connect to external conductive wires. The first cover lid 36 and the second cover lid 44 are metal lids. The top of the base 32 is provided with a first cavity 48, and the top of the base 32 is connected to the substrate 30 through first conductive wires 50 without using solder. Compared with solder, the first conductive wires 50 reduce heat dissipation effectively due to its smaller cross-sectional area. The crystal blank 34 is mounted in the first cavity 48. The first cover lid 36, mounted on the top of the base 32, seals the first cavity 48. The first cover lid 36 and the base 32 form airtight joints. The IC chip 38 is mounted on the bottom of the base 32. The base 32 is mounted on the substrate 30 through the IC chip 38 and the heat-insulating adhesive 40, the IC chip 38 may be connected to the bottom of the base 32 through second conductive wires 52 or others, and the heat-insulating adhesive 40 encapsulates the IC chip 38 and the second conductive wires 52 or others. The IC chip 38 needs higher thermal stability compared with the crystal blank 34. Thus, the IC chip 38 is mounted on the substrate 30 through the heat-insulating adhesive 40, and the heat-insulating adhesive 40 encapsulates the IC chip 38, thereby achieving the good thermal uniformity, maintaining the oven stability, and reducing the power consumption. The first heater 42 is embedded in the base 32 and located between the IC chip 38 and the crystal blank 34. The first heater 42 establishes a symmetric thermal field with respect to the IC chip 38 and the crystal blank 34, and the IC chip 38 and the crystal blank 34 are structurally symmetric to the first heater 42. The first heater 42 heats the structure upward and downward simultaneously, and thus the thermal uniformity is good. As a result, the thermal gradient between the IC chip 38 and the crystal blank 34 is small. Therefore, the OCXO can achieve very good stability in controlling the oven temperature and good thermal uniformity, maintain good temperature stability of crystal oscillator, and reduce the power consumption. The temperature sensor 46 is mounted on the IC chip 38, arranged between the IC chip 38 and the heat-insulating adhesive 40, and encapsulated in the heat-insulating adhesive 40. The second cover lid 44, mounted on the top of the substrate 30, cooperates with the substrate 30 to form airtight joints and covers the base 32, the first conductive wires 50, the crystal blank 34, the first cover lid 36, the IC chip 38, the heat-insulating adhesive 40, the second conductive wires 52, the temperature sensor 46, and the first heater 42.

Figure 4:
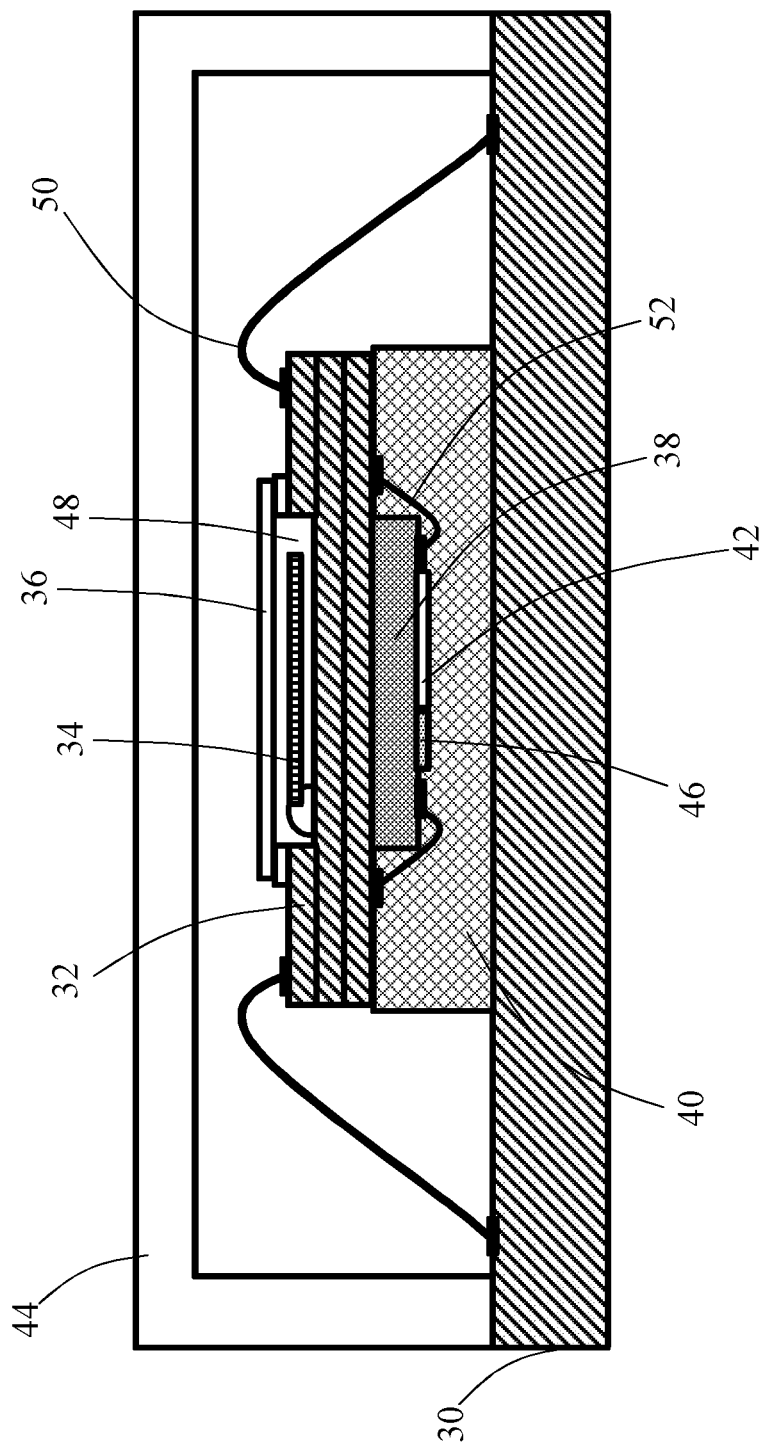
FIG. 4 is a diagram schematically showing an oven controlled crystal oscillator according to the second embodiment of the present invention.

Refer to FIG. 4. The second embodiment of the OCXO of the present invention is introduced as below. The second embodiment is different from the first embodiment in the position of the first heater 42. In the second embodiment, the first heater 42 is mounted on the IC chip 38 and arranged between the IC chip 38 and the heat-insulating adhesive 40. The heat-insulating adhesive 40 encapsulates the first heater 42 to greatly reduce heat dissipation.

Figure 5:
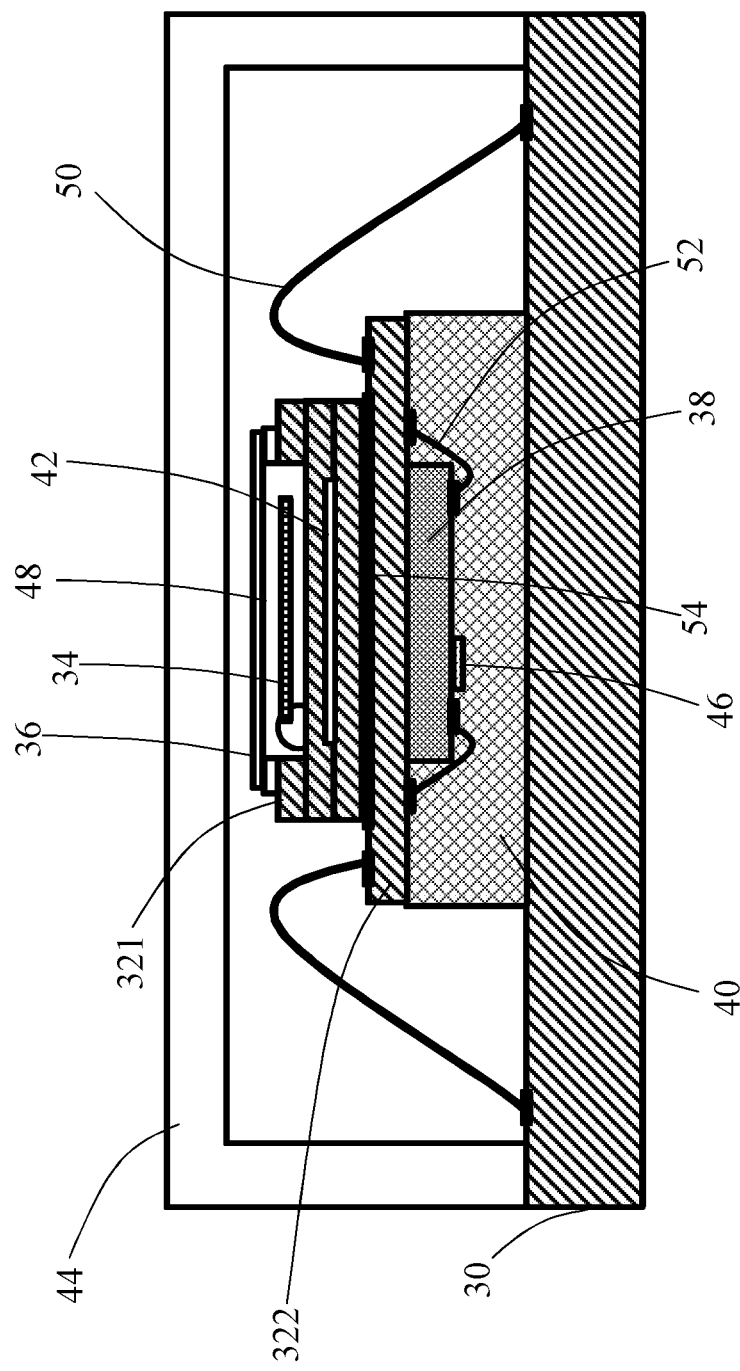
FIG. 5 is a diagram schematically showing an oven controlled crystal oscillator according to the third embodiment of the present invention.

Refer to FIG. 5. The third embodiment of the OCXO of the present invention is introduced as below. The OCXO comprises a substrate 30, a first base 321, a second base 322, a crystal blank 34, a first cover lid 36, an integrated circuit (IC) chip 38, a heat-insulating adhesive 40, a first heater 42, a second cover lid 44, and a temperature sensor 46. In the third embodiment, the substrate 30 may be a ceramic substrate and each of the first base 321 and the second base 322 may be a ceramic base. Each of the ceramic substrate and the ceramic base is embedded with conductive traces and conductive vias to electrically connect to external conductive wires. The first cover lid 36 and the second cover lid 44 are metal lids. The top of the first base 321 is provided with a first cavity 48, and the first base 321 is mounted on the second base 322 through solder 54. The top of the second base 322 is connected to the substrate 30 through first conductive wires 50 without using solder. Compared with solder, the first conductive wires 50 reduce heat dissipation effectively due to its smaller cross-sectional area. The crystal blank 34 is mounted in the first cavity 48. The first cover lid 36, mounted on the top of the first base 321, seals the first cavity 48. The first cover lid 36 and the first base 321 form airtight joints. The IC chip 38 is mounted on the bottom of the second base 322. The second base 322 is mounted on the substrate 30 through the IC chip 38 and the heat-insulating adhesive 40, the IC chip 38 may be connected to the bottom of the second base 322 through second conductive wires 52 or others, and the heat-insulating adhesive 40 encapsulates the IC chip 38 and the second conductive wires 52 or others. The IC chip 38 needs higher thermal stability compared with the crystal blank 34. Thus, the IC chip 38 is mounted on the substrate 30 through the heat-insulating adhesive 40, and the heat-insulating adhesive 40 encapsulates the IC chip 38, thereby achieving the good thermal uniformity, maintaining the oven stability, and reducing the power consumption. The first heater 42 is embedded in the first base 321 and located between the IC chip 38 and the crystal blank 34. The first heater 42 establishes a symmetric thermal field with respect to the IC chip 38 and the crystal blank 34, and the IC chip 38 and the crystal blank 34 are structurally symmetric to the first heater 42. The first heater 42 heats the structure upward and downward simultaneously, and thus the thermal uniformity is good. As a result, the thermal gradient between the IC chip 38 and the crystal blank 34 is small. Therefore, the OCXO can achieve very good stability in controlling the oven temperature and good thermal uniformity, maintain good temperature stability of crystal oscillator, and reduce the power consumption. The temperature sensor 46 is mounted on the IC chip 38, arranged between the IC chip 38 and the heat-insulating adhesive 40, and encapsulated in the heat-insulating adhesive 40. The second cover lid 44, mounted on the top of the substrate 30, cooperates with the substrate 30 to form airtight joints and covers the first base 321, the second base 322, the solder 54, the first conductive wires 50, the crystal blank 34, the first cover lid 36, the IC chip 38, the heat-insulating adhesive 40, the second conductive wires 52, the temperature sensor 46, and the first heater 42.

Figure 6:
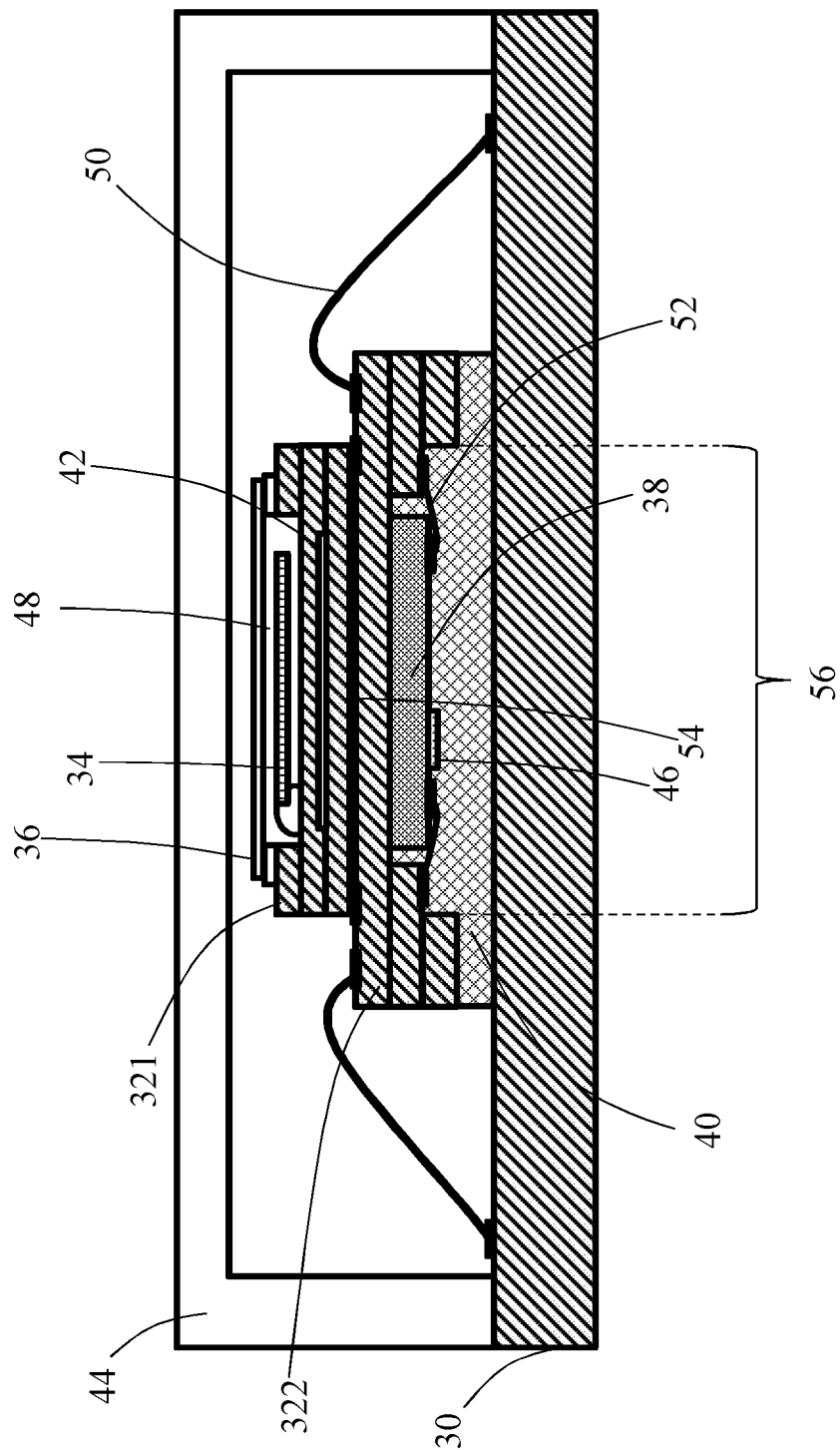
FIG. 6 is a diagram schematically showing an oven controlled crystal oscillator according to the fourth embodiment of the present invention.

Refer to FIG. 6. The fourth embodiment of the OCXO of the present invention is introduced as below. The fourth embodiment is different from the third embodiment in the structure of the second base 322. In the fourth embodiment, the bottom of the second base 322 is provided with a second cavity 56, the IC chip 38, the temperature sensor 46, and the second conductive wires 52 are mounted in the second cavity 322, and the second cavity 322 is filled with the heat-insulating adhesive 40 to improve the thermal stability of the IC chip 38.

Figure 7:
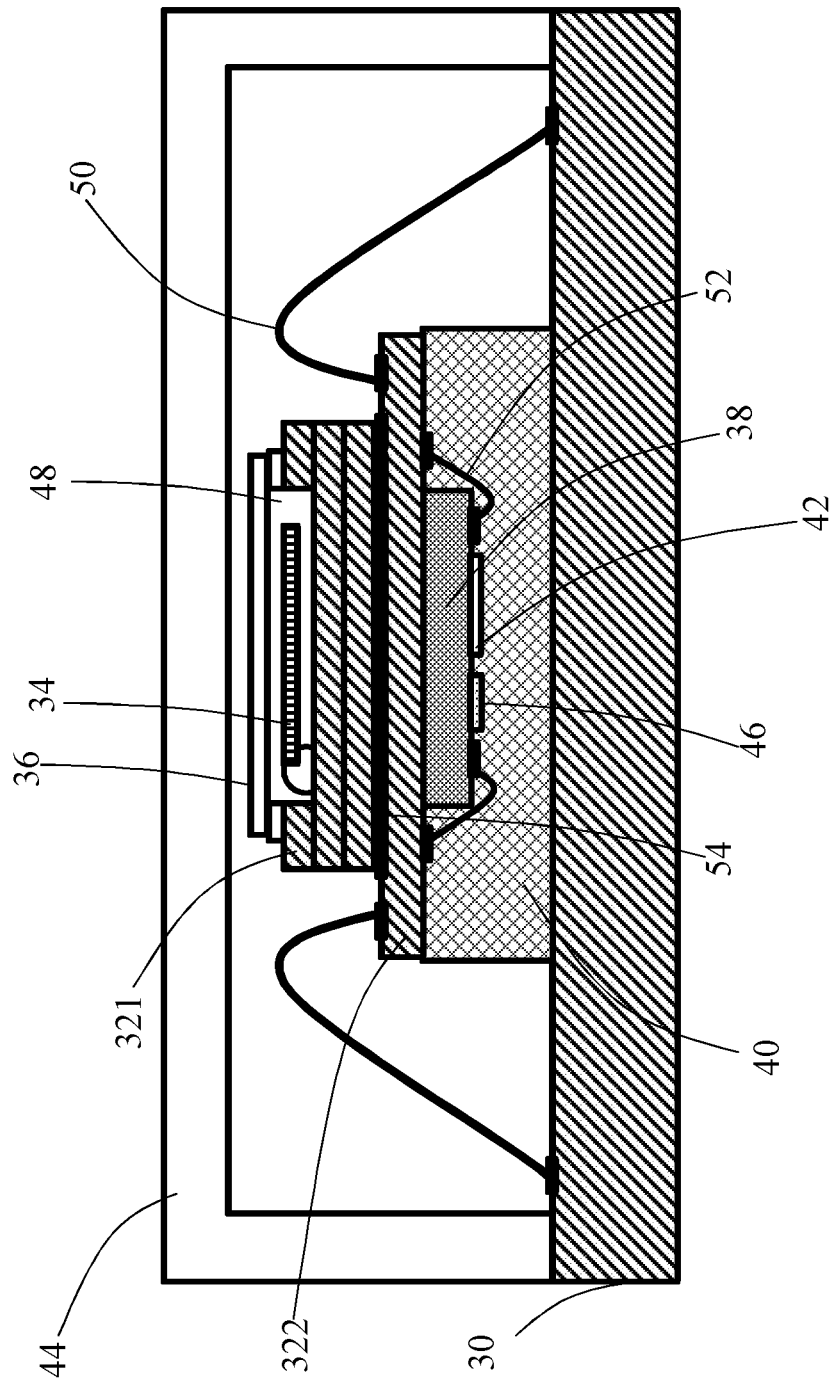
FIG. 7 is a diagram schematically showing an oven controlled crystal oscillator according to the fifth embodiment of the present invention.

Refer to FIG. 7. The fifth embodiment of the OCXO of the present invention is introduced as below. The fifth embodiment is different from the third embodiment in the position of the first heater 42. In the fifth embodiment, the first heater 42 is mounted on the IC chip 38 and arranged between the IC chip 38 and the heat-insulating adhesive 40. The heat-insulating adhesive 40 encapsulates the first heater 42 to greatly reduce heat dissipation.

Figure 8:
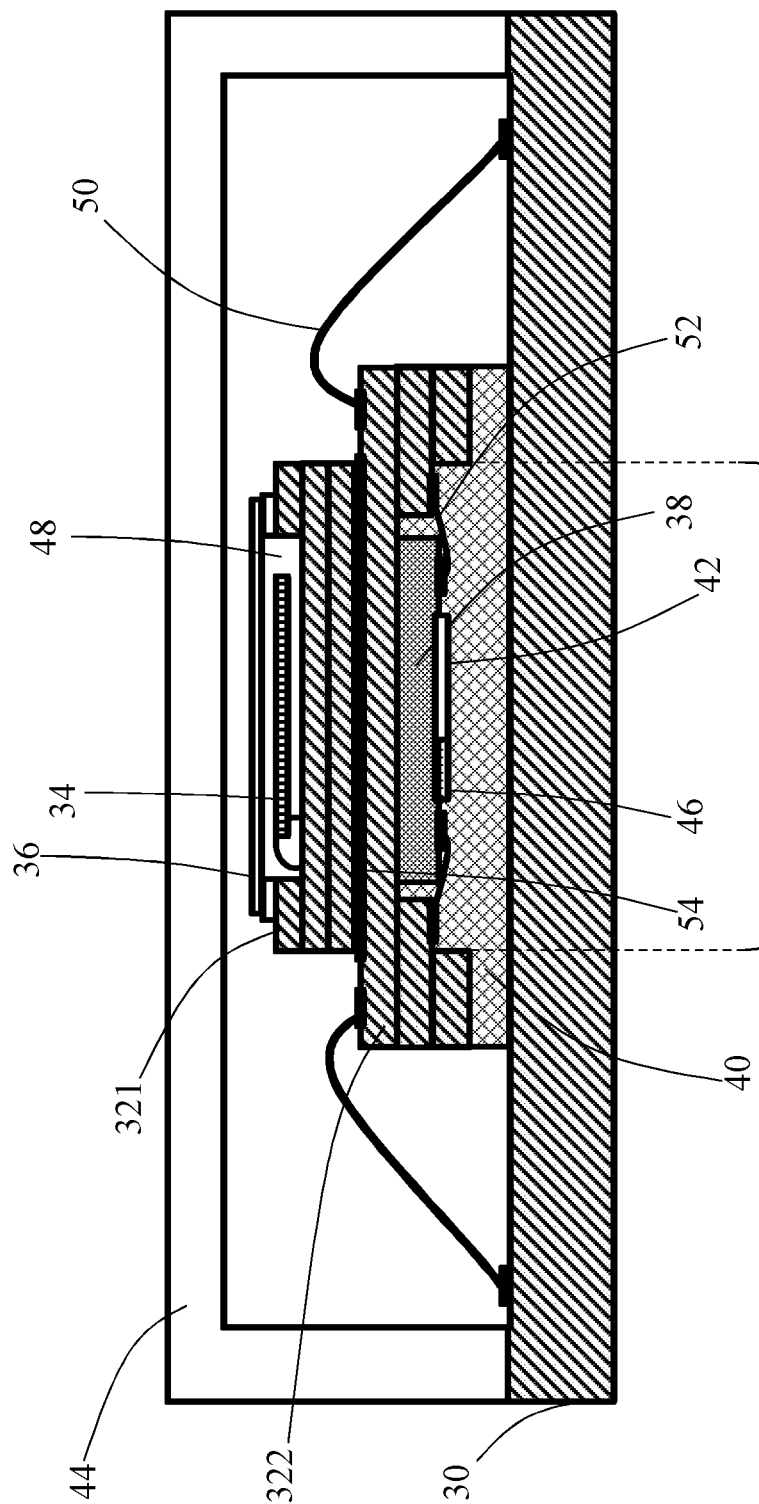
FIG. 8 is a diagram schematically showing an oven controlled crystal oscillator according to the sixth embodiment of the present invention.

Refer to FIG. 8. The sixth embodiment of the OCXO of the present invention is introduced as below. The sixth embodiment is different from the fifth embodiment in the structure of the second base 322. In the sixth embodiment, the bottom of the second base 322 is provided with a second cavity 56, the IC chip 38, the first heater 42, the temperature sensor 46, and the second conductive wires 52 are mounted in the second cavity 322, and the second cavity 322 is filled with the heat-insulating adhesive 40 to improve the thermal stability of the IC chip 38.

Figure 9:
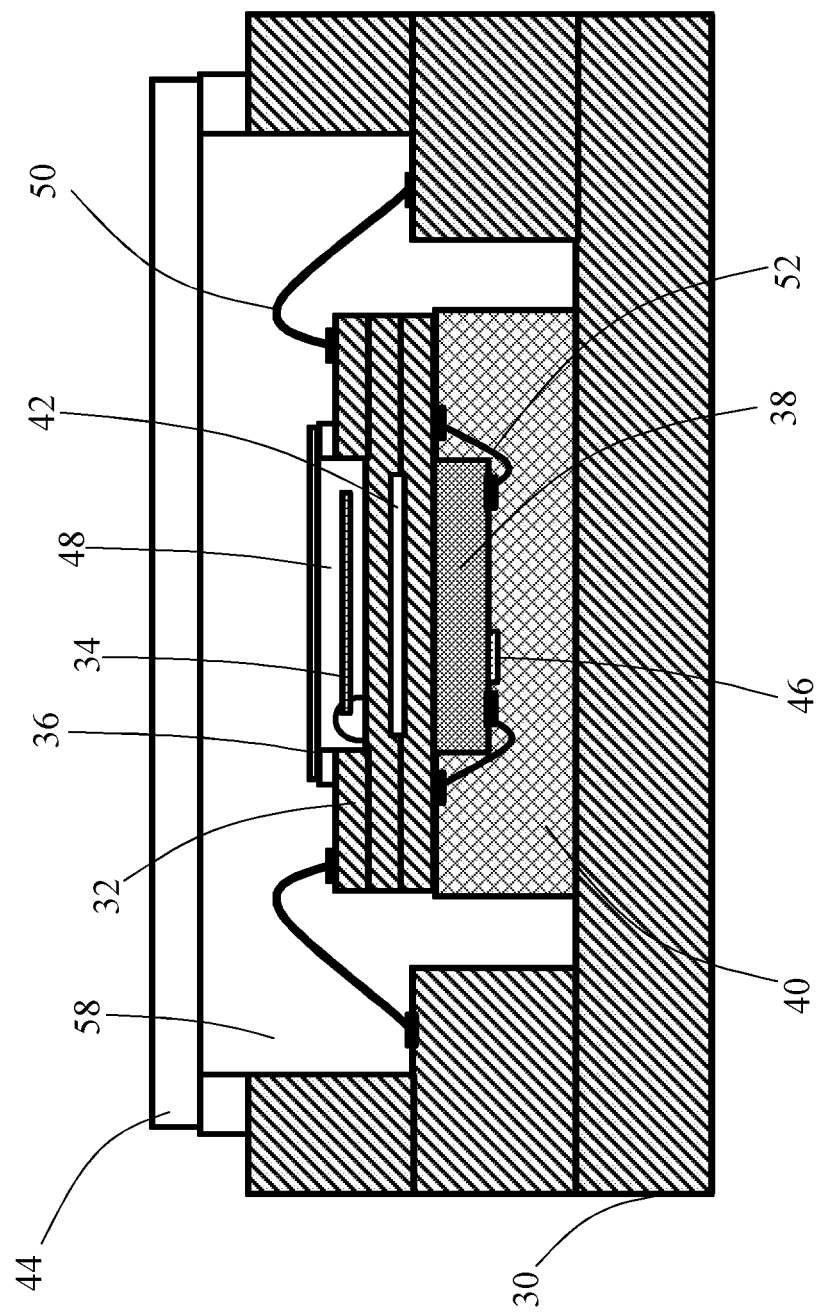
FIG. 9 is a diagram schematically showing an oven controlled crystal oscillator according to the seventh embodiment of the present invention.

Refer to FIG. 9. The seventh embodiment of the OCXO of the present invention is introduced as below. The seventh embodiment is different from the first embodiment in the structure of the substrate 30. In the seventh embodiment, the top of the substrate 30 is provided with a third cavity 58, the base 32, the first conductive wires 50, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the seventh embodiment achieves the better thermal stability.

Figure 10:
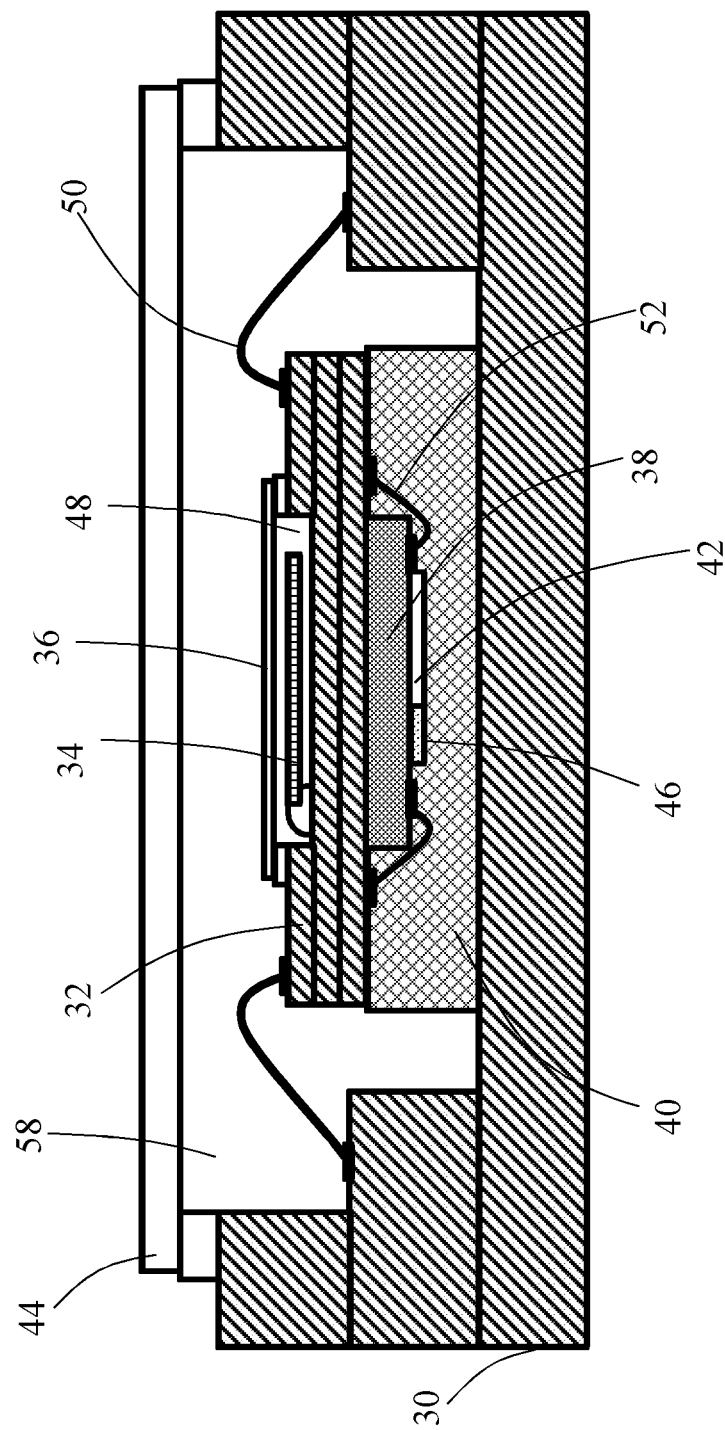
FIG. 10 is a diagram schematically showing an oven controlled crystal oscillator according to the eighth embodiment of the present invention.

Refer to FIG. 10. The eighth embodiment of the OCXO of the present invention is introduced as below. The eighth embodiment is different from the second embodiment in the structure of the substrate 30. In the eighth embodiment, the top of the substrate 30 is provided with a third cavity 58, the base 32, the first conductive wires 50, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the eighth embodiment achieves the better thermal stability.

Figure 11:
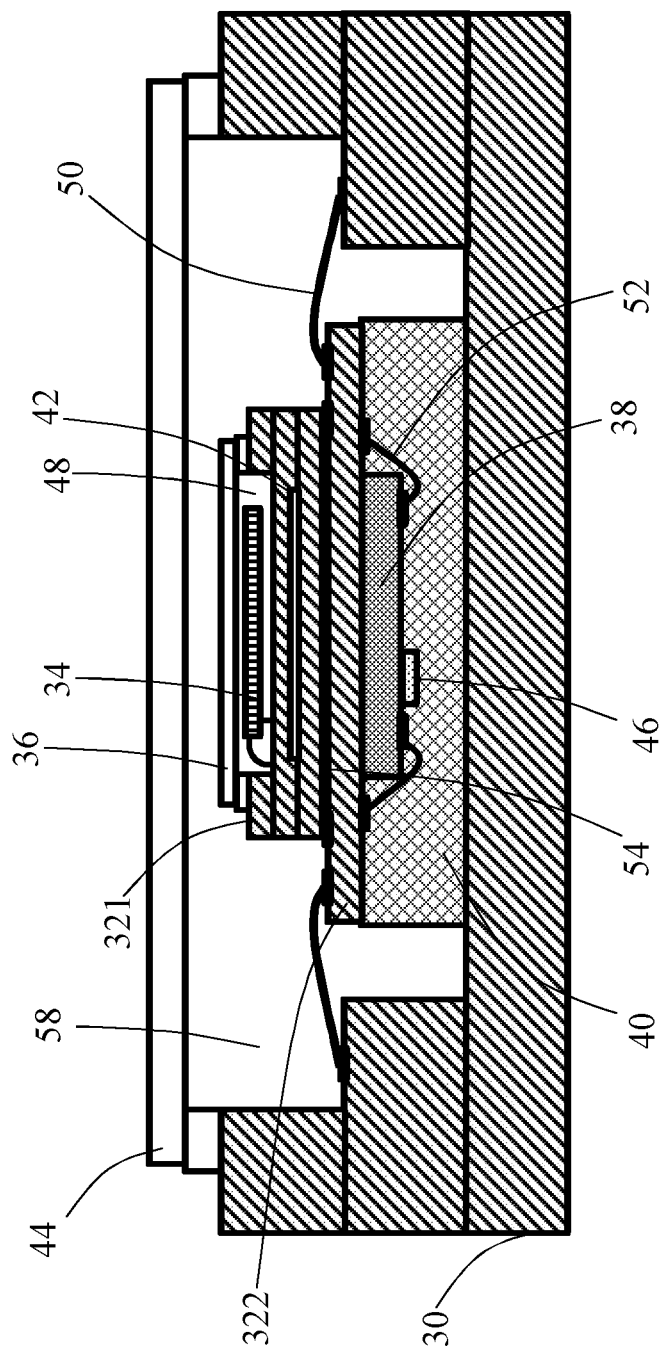
FIG. 11 is a diagram schematically showing an oven controlled crystal oscillator according to the ninth embodiment of the present invention.

Refer to FIG. 11. The ninth embodiment of the OCXO of the present invention is introduced as below. The ninth embodiment is different from the third embodiment in the structure of the substrate 30. In the ninth embodiment, the top of the substrate 30 is provided with a third cavity 58, the first base 321, the second base 322, the first conductive wires 50, the solder 54, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the ninth embodiment achieves the better thermal stability.

Figure 12:
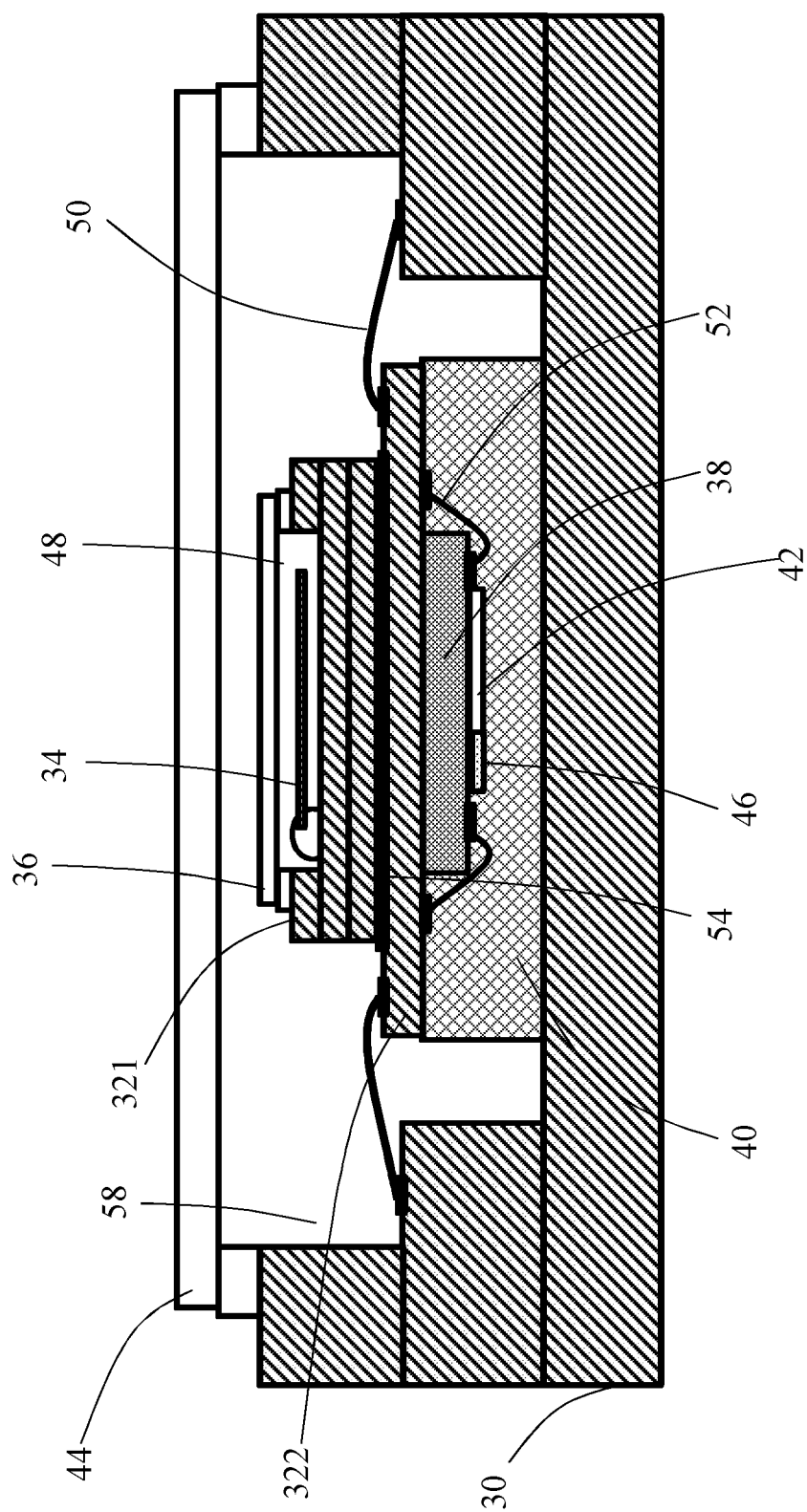
FIG. 12 is a diagram schematically showing an oven controlled crystal oscillator according to the tenth embodiment of the present invention.

Refer to FIG. 12. The tenth embodiment of the OCXO of the present invention is introduced as below. The tenth embodiment is different from the fifth embodiment in the structure of the substrate 30. In the tenth embodiment, the top of the substrate 30 is provided with a third cavity 58, the first base 321, the second base 322, the first conductive wires 50, the solder 54, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the tenth embodiment achieves the better thermal stability.

Figure 13:
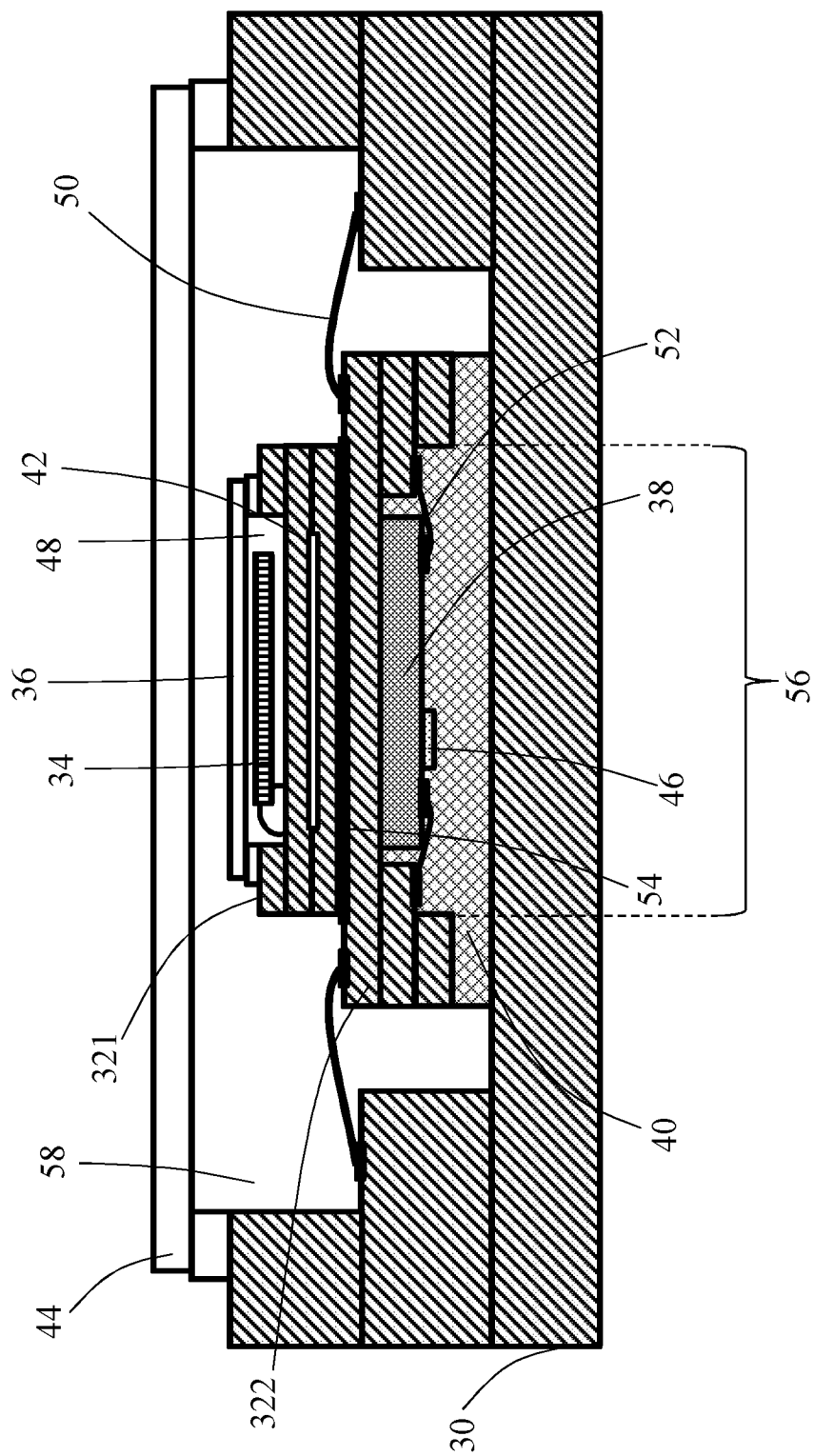
FIG. 13 is a diagram schematically showing an oven controlled crystal oscillator according to the eleventh embodiment of the present invention.

Refer to FIG. 13. The eleventh embodiment of the OCXO of the present invention is introduced as below. The eleventh embodiment is different from the fourth embodiment in the structure of the substrate 30. In the eleventh embodiment, the top of the substrate 30 is provided with a third cavity 58, the first base 321, the second base 322, the first conductive wires 50, the solder 54, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the eleventh embodiment achieves the better thermal stability.

Figure 14:
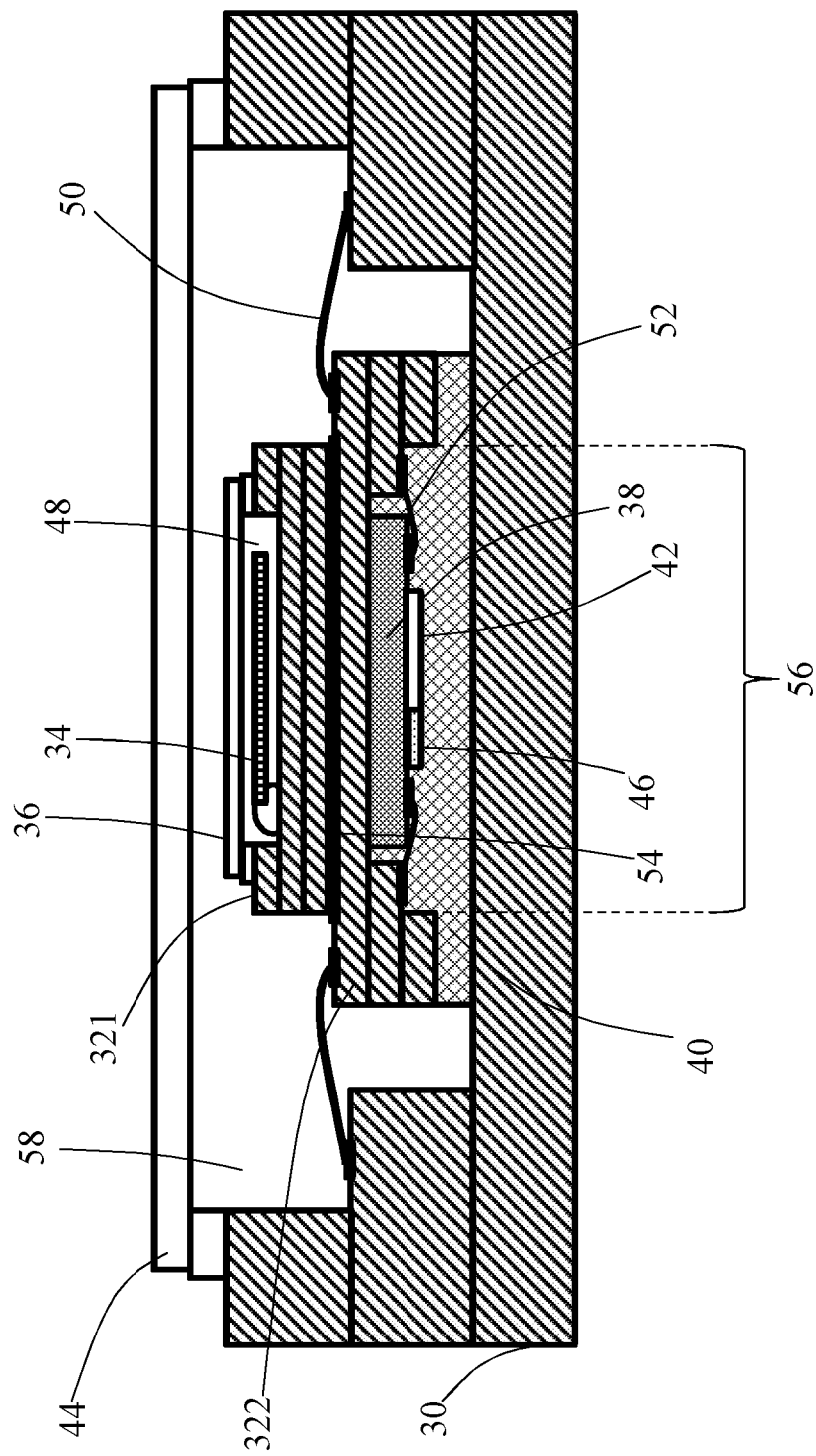
FIG. 14 is a diagram schematically showing an oven controlled crystal oscillator according to the twelfth embodiment of the present invention.

Refer to FIG. 14. The twelfth embodiment of the OCXO of the present invention is introduced as below. The twelfth embodiment is different from the sixth embodiment in the structure of the substrate 30. In the twelfth embodiment, the top of the substrate 30 is provided with a third cavity 58, the first base 321, the second base 322, the first conductive wires 50, the solder 54, the crystal blank 34, the first cover lid 36, the IC chip 38, the heat-insulating adhesive 40, the second conductive wires 52, the temperature sensor 46, and the first heater 42 are mounted in the third cavity 58, and the second cover lid 44 seals the third cavity 58. Compared with the second cover lid 44, the substrate 30 has a larger area and the low thermal conductivity. Thus, the OCXO of the twelfth embodiment achieves the better thermal stability.

Figure 15:
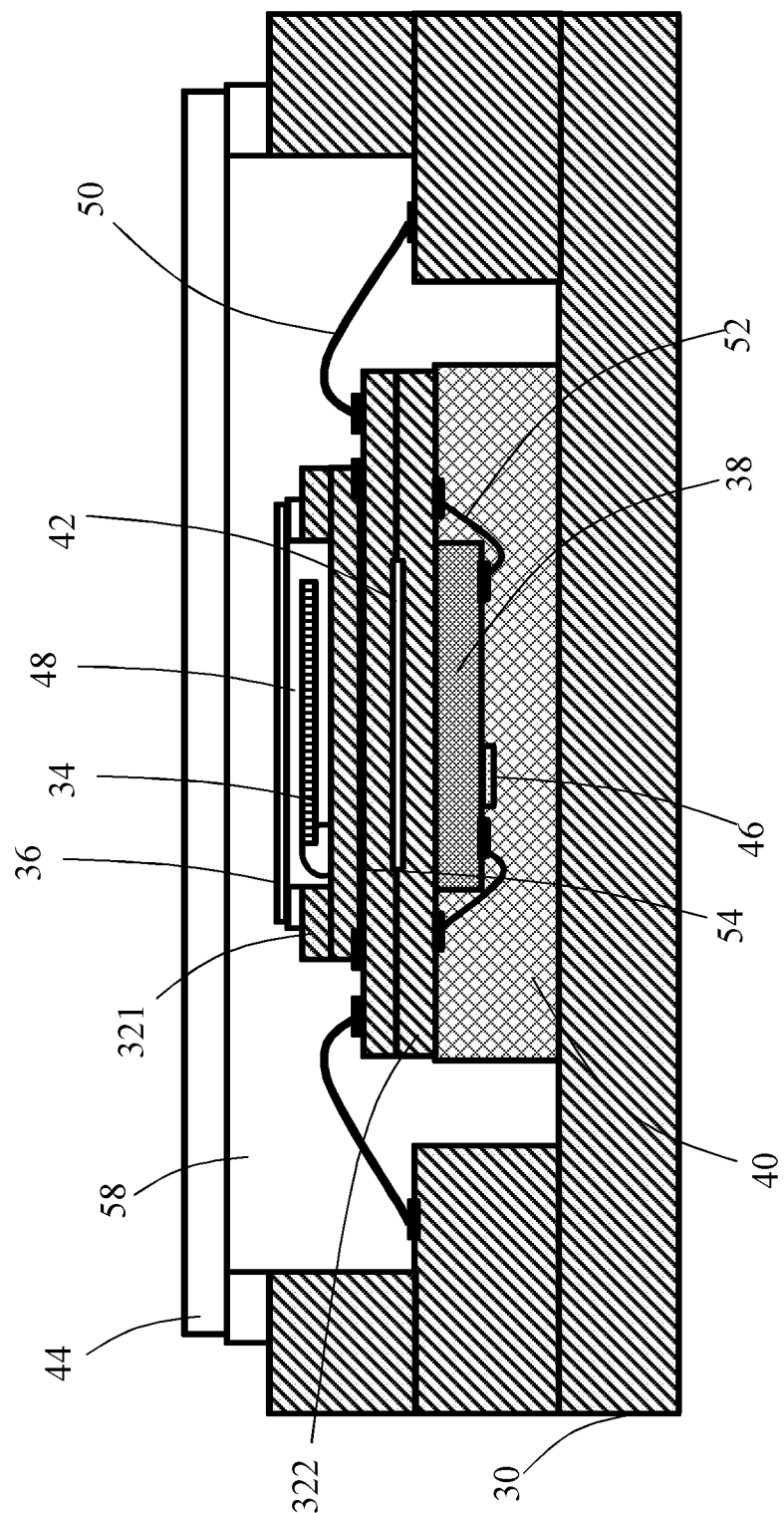
FIG. 15 is a diagram schematically showing an oven controlled crystal oscillator according to the thirteenth embodiment of the present invention.

Refer to FIG. 15. The thirteenth embodiment of the OCXO of the present invention is introduced as below. The thirteenth embodiment is different from the ninth embodiment in the position of the first heater 42. In the thirteenth embodiment, the first heater 42 is embedded in the second base 322 and located between the IC chip 38 and the crystal blank 34, the first heater 42 establishes a symmetric thermal field with respect to the IC chip 38 and the crystal blank 34, and the IC chip 38 and the crystal blank 34 are structurally symmetric to the first heater 42. Compared with the ninth embodiment, the first heater 42 of the thirteenth embodiment is closer to the IC chip 38 to improve its thermal stability.

Figure 16:
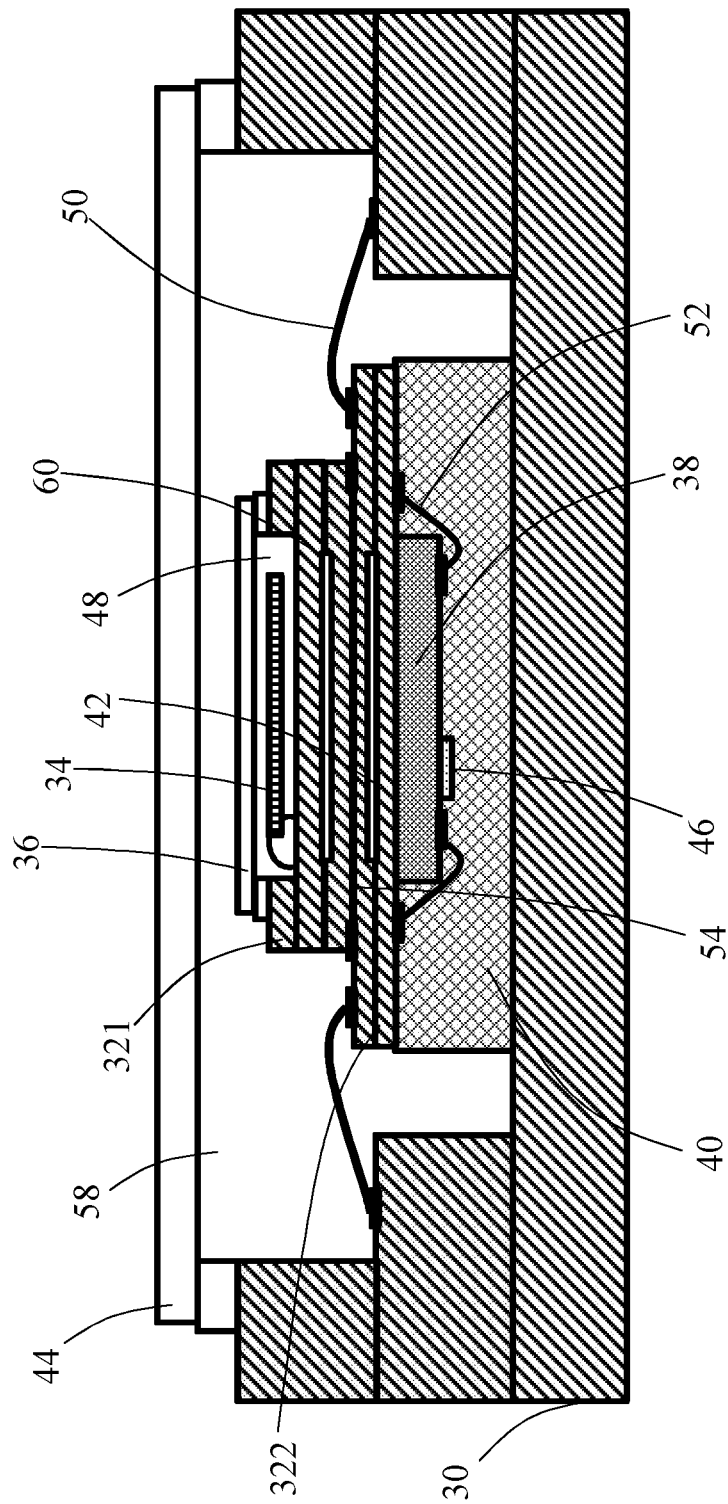
FIG. 16 is a diagram schematically showing an oven controlled crystal oscillator according to the fourteenth embodiment of the present invention.

Refer to FIG. 16. The fourteenth embodiment of the OCXO of the present invention is introduced as below. The fourteenth embodiment is different from the thirteenth embodiment in that the thirteenth embodiment further comprises a second heater 60 embedded in the first base 321 and located between the IC chip 38 and the crystal blank 34, and the first heater 42 and the second heater 60 establish the symmetric thermal field. Compared with the thirteenth embodiment, the second heater 60 can improve the thermal stability of the third cavity 58.

Figure 17:
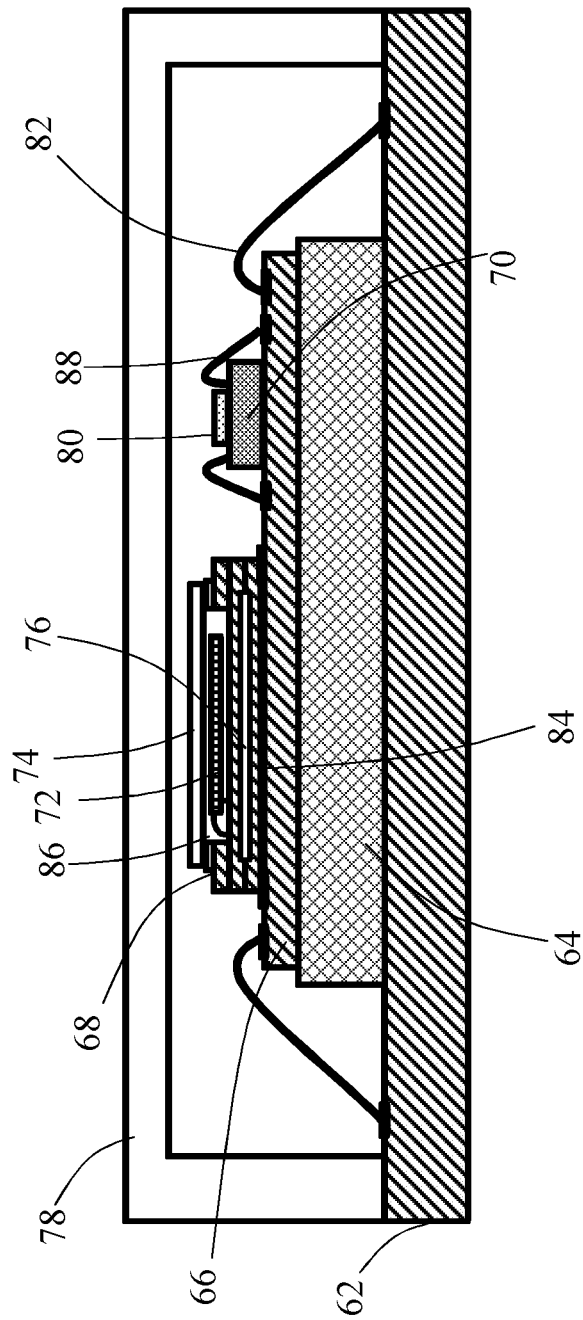
FIG. 17 is a diagram schematically showing an oven controlled crystal oscillator according to the fifteenth embodiment of the present invention.

Refer to FIG. 17. The fifteenth embodiment of the OCXO of the present invention is introduced as below. The OCXO comprises a substrate 62, a heat-insulating adhesive 64, a carrier 66, a base 68, an integrated circuit (IC) chip 70, a crystal blank 72, a first cover lid 74, a heater 76, a second cover lid 78, and a temperature sensor 80. For example, the first cover lid 74 and the second cover lid 78 are metal lids. Besides, the substrate 62 is a ceramic substrate, the carrier 66 is a ceramic carrier, and the base 68 is a ceramic base. Each of the ceramic substrate, the ceramic carrier, and the ceramic base is embedded with conductive traces and conductive vias to electrically connect to external conductive wires. The heat-insulating adhesive 64 is mounted on the substrate 62. The carrier 66 is mounted on the heat-insulating adhesive 64 and connected to the substrate 62 through first conductive wires 82 without using solder. Compared with solder, the first conductive wires 82 reduce heat dissipation effectively due to its smaller cross-sectional area. The base 68 and the IC chip 70 are mounted on the carrier 66. For example, the base 68 is mounted on the carrier 66 through solder 84. The top of the base 68 is provided with a first cavity 86, and the IC chip 70 may be connected to the carrier 66 through second conductive wires 88 or others. The crystal blank 72 is mounted in the first cavity 86. The first cover lid 74, mounted on the top of the base 68, seals the first cavity 86 and cooperates with the base 68 to form airtight joints. The heater 76 is embedded in the base 68. The temperature sensor 80 is mounted on the IC chip 70. The second cover lid 78, mounted on the top of the substrate 62, cooperates with the substrate 62 to form airtight joints and covers the base 68, the carrier 66, the first conductive wires 82, the crystal blank 72, the first cover lid 74, the IC chip 70, the heat-insulating adhesive 64, the second conductive wires 88, the temperature sensor 80, the solder 84, and the heater 76.

Figure 18:
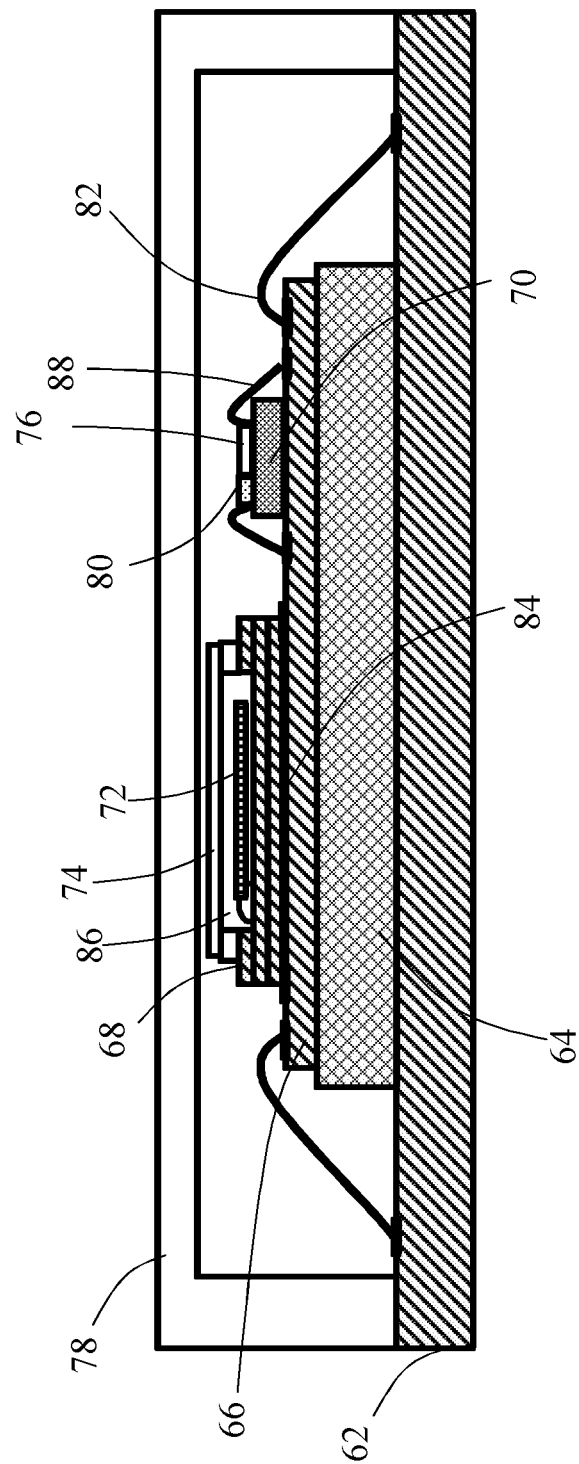
FIG. 18 is a diagram schematically showing an oven controlled crystal oscillator according to the sixteenth embodiment of the present invention.

Refer to FIG. 18. The sixteenth embodiment of the OCXO of the present invention is introduced as below. The sixteenth embodiment is different from the fifteenth embodiment in the position of the heater 76. In the sixteenth embodiment, the heater 76 is mounted on the IC chip 70 to improve the thermal stability of the IC chip 70.

Figure 19:
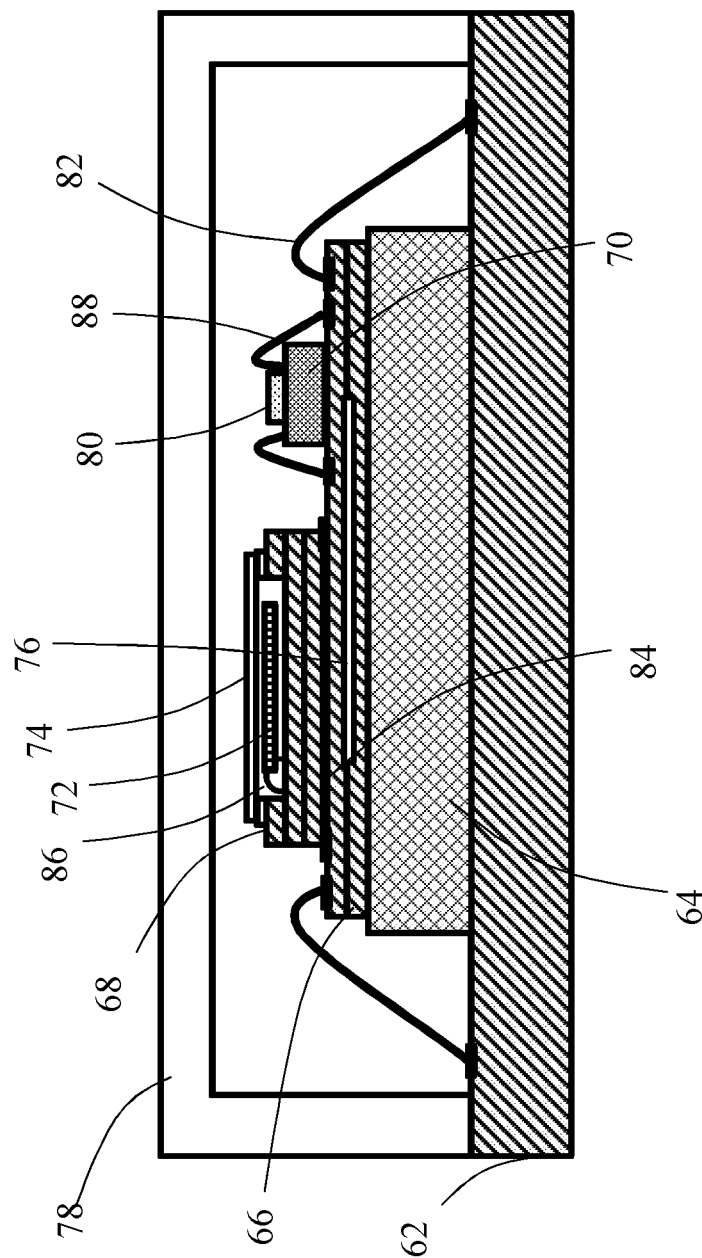
FIG. 19 is a diagram schematically showing an oven controlled crystal oscillator according to the seventeenth embodiment of the present invention.

Refer to FIG. 19. The seventeenth embodiment of the OCXO of the present invention is introduced as below. The seventeenth embodiment is different from the fifteenth embodiment in the position of the heater 76. In the seventeenth embodiment, the heater 76 is embedded in the carrier 66 to reduce the thermal gradient between the IC chip 70 and the crystal blank 72.

Figure 20:
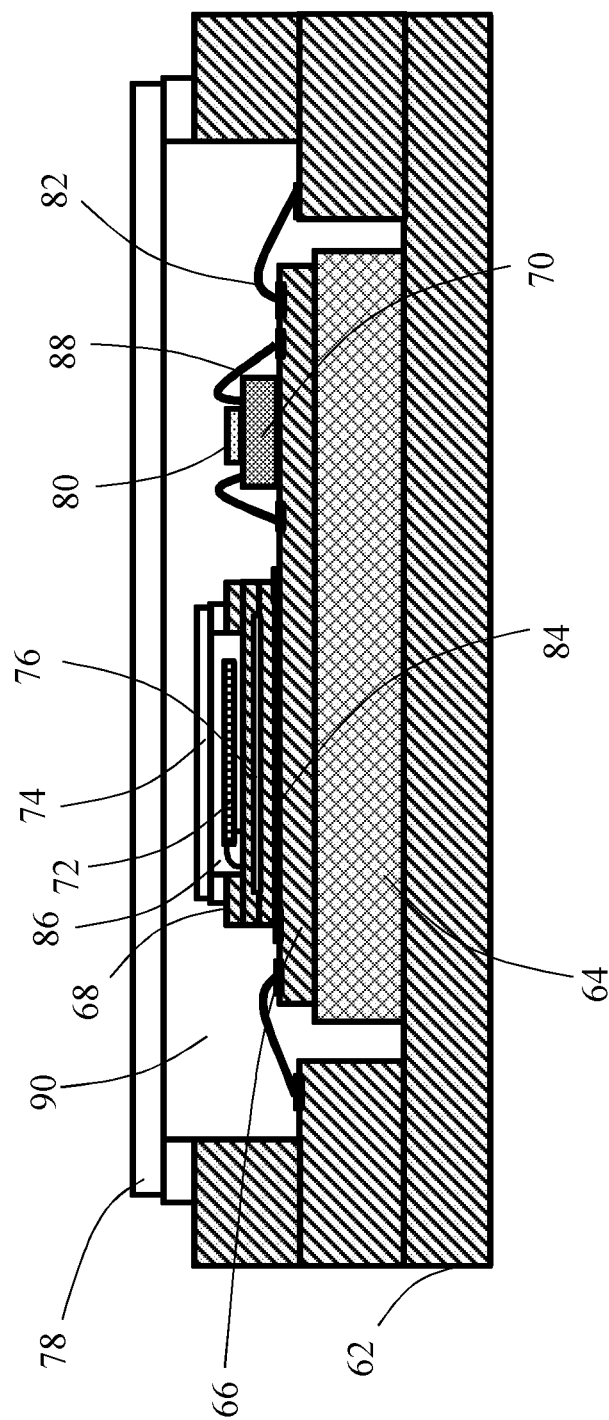
FIG. 20 is a diagram schematically showing an oven controlled crystal oscillator according to the eighteenth embodiment of the present invention.

Refer to FIG. 20. The eighteenth embodiment of the OCXO of the present invention is introduced as below. The eighteenth embodiment is different from the fifteenth embodiment in the structure of the substrate 62. In the eighteenth embodiment, the top of the substrate 62 is provided with a second cavity 90, the base 68, the carrier 66, the first conductive wires 82, the crystal blank 72, the first cover lid 74, the IC chip 70, the heat-insulating adhesive 64, the second conductive wires 88, and the heater 76 are mounted in the second cavity 90, and the second cover lid 78 seals the second cavity 90. Compared with the second cover lid 78, the substrate 62 has a larger area and the low thermal conductivity. Thus, the OCXO of the eighteenth embodiment achieves the better thermal stability.

Figure 21:
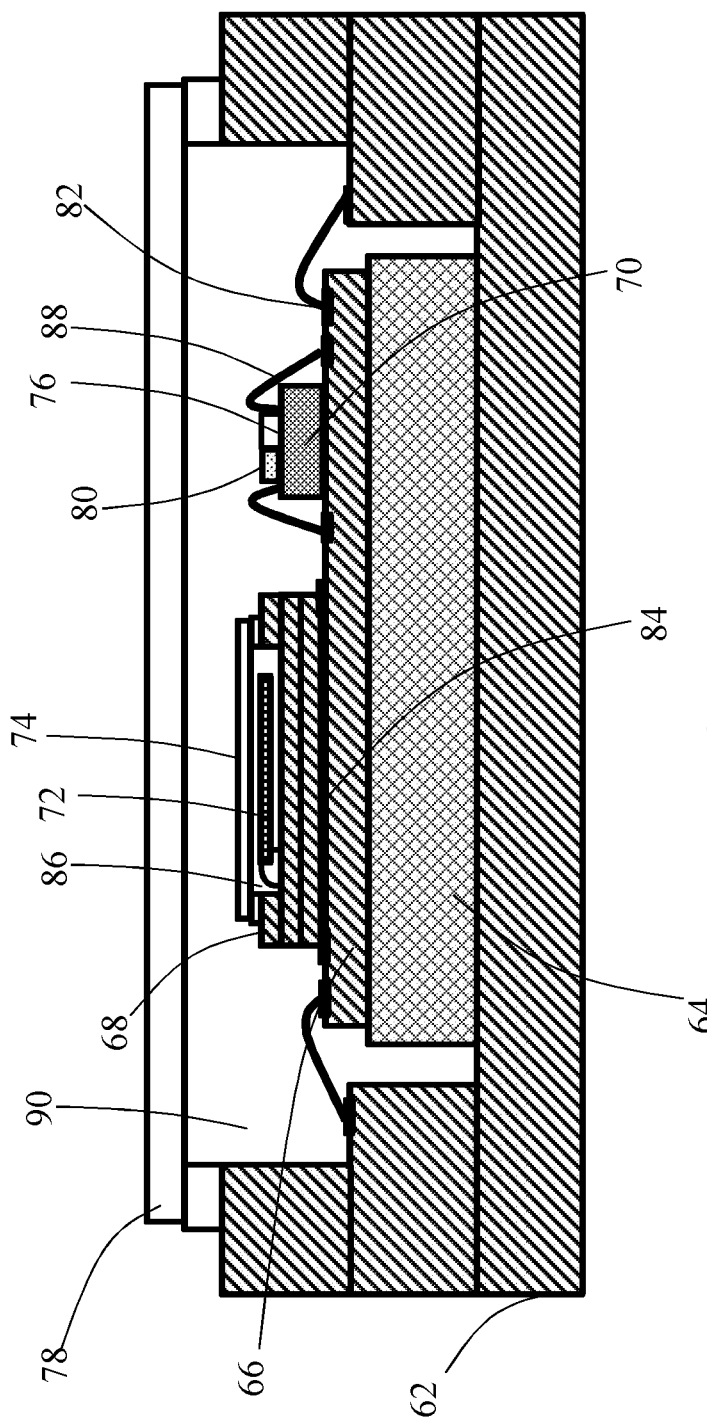
FIG. 21 is a diagram schematically showing an oven controlled crystal oscillator according to the nineteenth embodiment of the present invention.

Refer to FIG. 21. The nineteenth embodiment of the OCXO of the present invention is introduced as below. The nineteenth embodiment is different from the sixteenth embodiment in the structure of the substrate 62. In the nineteenth embodiment, the top of the substrate 62 is provided with a second cavity 90, the base 68, the carrier 66, the first conductive wires 82, the crystal blank 72, the first cover lid 74, the IC chip 70, the heat-insulating adhesive 64, the second conductive wires 88, and the heater 76 are mounted in the second cavity 90, and the second cover lid 78 seals the second cavity 90. Compared with the second cover lid 78, the substrate 62 has a larger area and the low thermal conductivity. Thus, the OCXO of the nineteenth embodiment achieves the better thermal stability.

Figure 22:
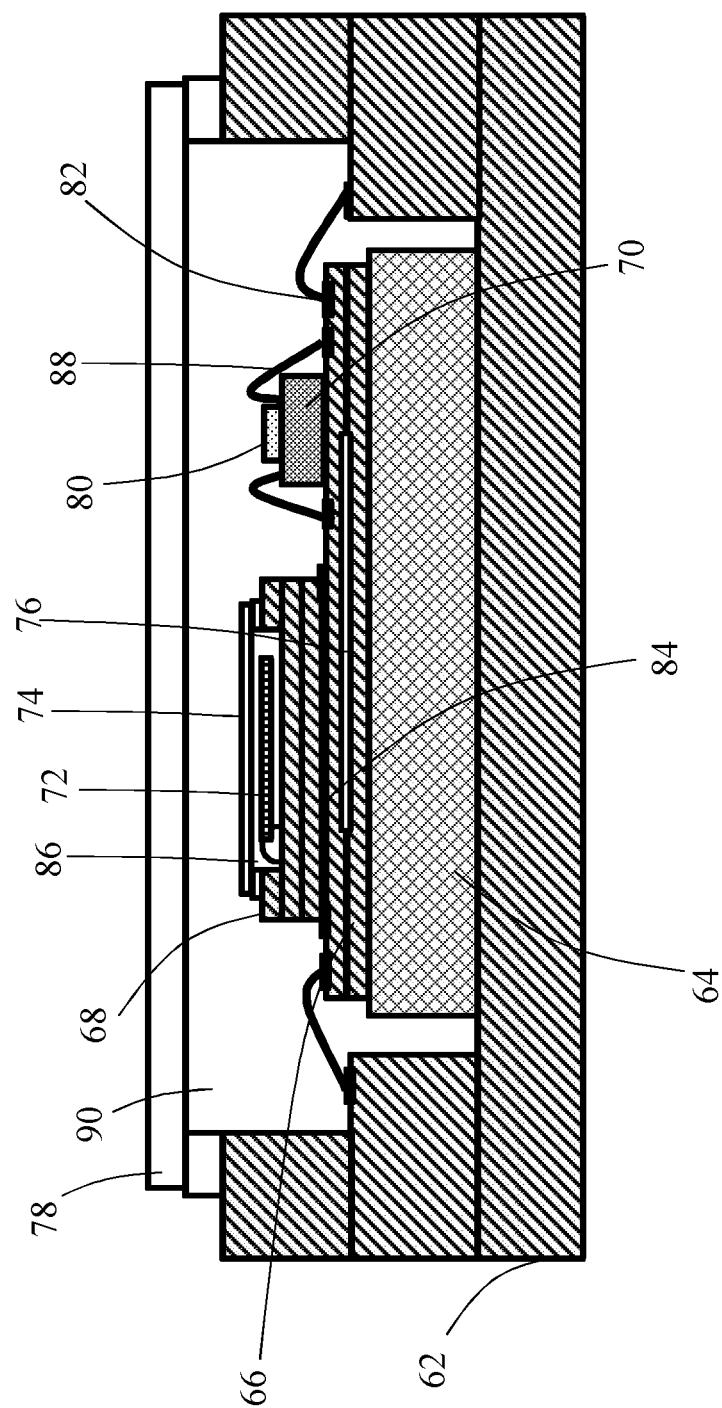
FIG. 22 is a diagram schematically showing an oven controlled crystal oscillator according to the twentieth embodiment of the present invention.

Refer to FIG. 22. The twentieth embodiment of the OCXO of the present invention is introduced as below. The twentieth embodiment is different from the seventeenth embodiment in the structure of the substrate 62. In the twentieth embodiment, the top of the substrate 62 is provided with a second cavity 90, the base 68, the carrier 66, the first conductive wires 82, the crystal blank 72, the first cover lid 74, the IC chip 70, the heat-insulating adhesive 64, the second conductive wires 88, and the heater 76 are mounted in the second cavity 90, and the second cover lid 78 seals the second cavity 90. Compared with the second cover lid 78, the substrate 62 has a larger area and the low thermal conductivity. Thus, the OCXO of the twentieth embodiment achieves the better thermal stability.

Figure 23:
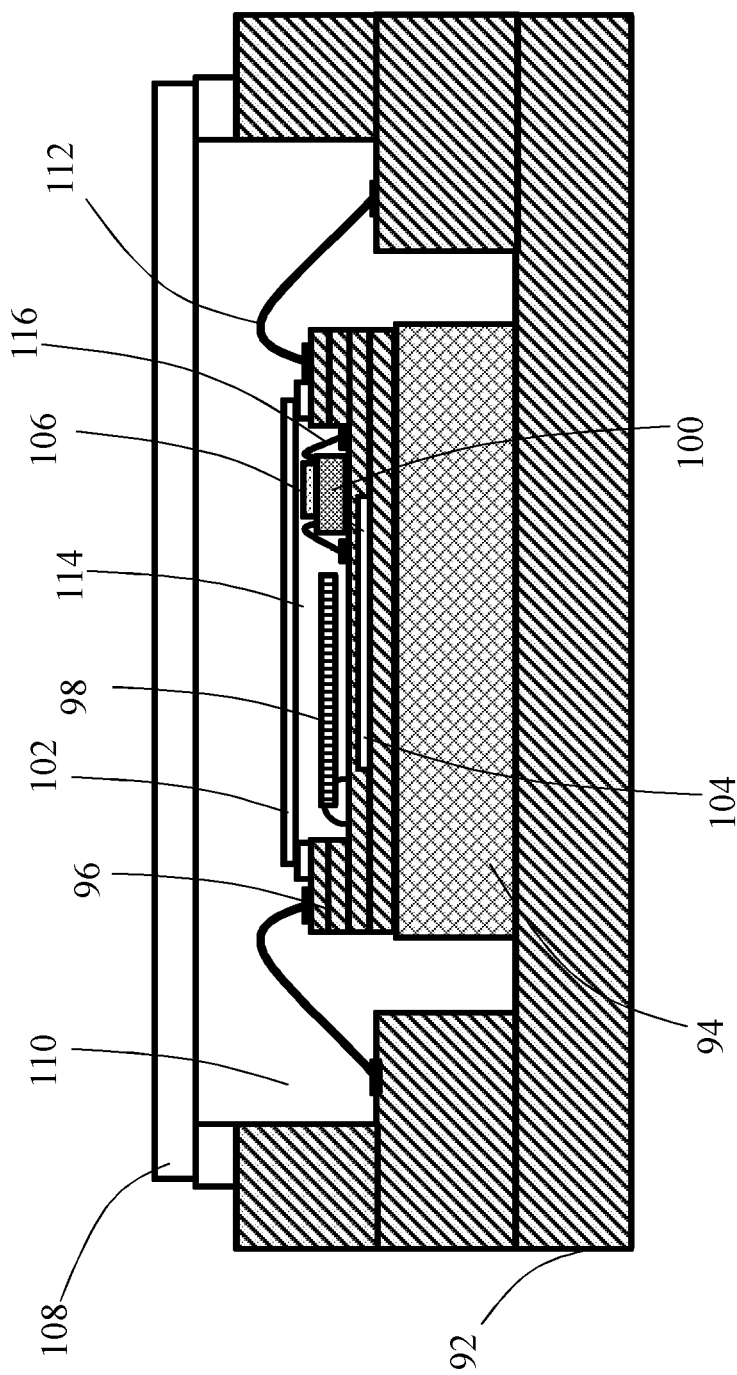
FIG. 23 is a diagram schematically showing an oven controlled crystal oscillator according to the twenty-first embodiment of the present invention.

Refer to FIG. 23. The twenty-first embodiment of the OCXO of the present invention is introduced as below. The OCXO comprises a substrate 92, a heat-insulating adhesive 94, a base 96, a crystal blank 98, an integrated circuit (IC) chip 100, a first cover lid 102, a heater 104, a temperature sensor 106, and a second cover lid 108. For example, the first cover lid 102 and the second cover lid 108 are metal lids, the substrate 92 is a ceramic substrate, and the base 96 is a ceramic base. Each of the ceramic substrate and the ceramic base is embedded with conductive traces and conductive vias to electrically connect to external conductive wires. The top of the substrate 92 is provided with a first cavity 110. The heat-insulating adhesive 94 is mounted in the first cavity 110. The base 96 is mounted on the heat-insulating adhesive 94, mounted in the first cavity 110, and connected to the substrate 92 through first conductive wires 112 without using solder, and the top of the base 96 is provided with a second cavity 114. Compared with solder, the first conductive wires 102 reduce heat dissipation effectively due to its smaller cross-sectional area. The crystal blank 98 and the IC chip 100 are mounted in the second cavity 114, and the IC chip 100 is connected to the base 96 through second conductive wires 116. The first cover lid 102, mounted on the top of the base 96, cooperates with the base 96 to form airtight joints and seals the second cavity 114. The heater 104 is embedded in the base 96. The temperature sensor 106 is mounted on the IC chip 100 and accommodated in the second cavity 114. The second cover lid 108, mounted on the top of the substrate 92, cooperates with the substrate 92 to form airtight joints and covers the base 96, the first conductive wires 112, the crystal blank 98, the first cover lid 102, the IC chip 100, the heat-insulating adhesive 94, the second conductive wires 116, the temperature sensor 106, and the heater 104.

In conclusion, the present invention connects an inner base to an external substrate through conductive wires without using solder, thereby reducing the heat dissipation and power consumption, achieving the good thermal uniformity, and maintaining the oven stability.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An oven controlled crystal oscillator comprising:
   a substrate;
   at least one base with a top thereof provided with a first cavity, and the top of the at least one base is connected to the substrate through conductive wires;
   a crystal blank mounted in the first cavity;
   a first cover lid, mounted on the top of the at least one base, sealing the first cavity;
   an integrated circuit (IC) chip mounted on a bottom of the at least one base;
   a heat-insulating adhesive, the at least one base is mounted on the substrate through the IC chip and the heat-insulating adhesive, the IC chip is connected to the bottom of the at least one base, and the heat-insulating adhesive encapsulates the IC chip;
   a first heater combined with one of the at least one base and the IC chip; and
   a second cover lid, mounted on a top of the substrate, covering the at least one base, the conductive wires, the crystal blank, the first cover lid, the IC chip, the heat-insulating adhesive, and the first heater.

2. The oven controlled crystal oscillator according to claim 1, further comprising a temperature sensor mounted on the IC chip and arranged between the IC chip and the heat-insulating adhesive, and the second cover lid covers the temperature sensor.

3. The oven controlled crystal oscillator according to claim 1, wherein the first heater is embedded in the at least one base and located between the IC chip and the crystal blank, the first heater establishes a symmetric thermal field with respect to the IC chip and the crystal blank, and the IC chip and the crystal blank are structurally symmetric to the first heater.

4. The oven controlled crystal oscillator according to claim 1, wherein the first heater is mounted on the IC chip and arranged between the IC chip and the heat-insulating adhesive.

5. The oven controlled crystal oscillator according to claim 1, wherein the at least one base further comprises a first base and a second base, a top of the first base is provided with the first cavity, the first cover lid is mounted on the top of the first base, the first base is mounted on the second base through solder, a top of the second base is connected to the substrate through the conductive wires without using solder, the IC chip is mounted on a bottom of the second base, the second base is mounted on the substrate through the IC chip and the heat-insulating adhesive, the IC chip is connected to the bottom of the second base, the first heater is embedded in the first base and located between the IC chip and the crystal blank, the first heater establishes a symmetric thermal field with respect to the IC chip and the crystal blank, and the IC chip and the crystal blank are structurally symmetric to the first heater.

6. The oven controlled crystal oscillator according to claim 5, wherein the bottom of the second base is provided with a second cavity, the IC chip is mounted in the second cavity, and the second cavity is filled with the heat-insulating adhesive.

7. The oven controlled crystal oscillator according to claim 1, wherein the at least one base further comprises a first base and a second base, a top of the first base is provided with the first cavity, the first cover lid is mounted on the top of the first base, the first base is mounted on the second base through solder, a top of the second base is connected to the substrate through the conductive wires without using solder, the IC chip is mounted on a bottom of the second base, the second base is mounted on the substrate through the IC chip and the heat-insulating adhesive, the IC chip is connected to the bottom of the second base, and the first heater is mounted on the IC chip and arranged between the IC chip and the heat-insulating adhesive.

8. The oven controlled crystal oscillator according to claim 7, wherein the bottom of the second base is provided with a second cavity, the IC chip is mounted in the second cavity, and the second cavity is filled with the heat-insulating adhesive.

9. The oven controlled crystal oscillator according to claim 1, wherein the at least one base further comprises a first base and a second base, a top of the first base is provided with the first cavity, the first cover lid is mounted on the top of the first base, the first base is mounted on the second base through solder, a top of the second base is connected to the substrate through the conductive wires without using solder, the IC chip is mounted on a bottom of the second base, the second base is mounted on the substrate through the IC chip and the heat-insulating adhesive, the IC chip is connected to the bottom of the second base, the first heater is embedded in the second base and located between the IC chip and the crystal blank, the first heater establishes a symmetric thermal field with respect to the IC chip and the crystal blank, and the IC chip and the crystal blank are structurally symmetric to the first heater.

10. The oven controlled crystal oscillator according to claim 9, further comprising a second heater embedded in the first base and located between the IC chip and the crystal blank, and the first heater and the second heater establish the symmetric thermal field.

11. The oven controlled crystal oscillator according to claim 1, wherein the first cover lid and the second cover lid are metal lids.

12. The oven controlled crystal oscillator according to claim 1, wherein the substrate is a ceramic substrate and the at least one base is a ceramic base.

13. The oven controlled crystal oscillator according to claim 1, wherein the top of the substrate is provided with a third cavity, the at least one base, the conductive wires, the crystal blank, the first cover lid, the IC chip, the heat-insulating adhesive, and the first heater are mounted in the third cavity, and the second cover lid seals the third cavity.

14. An oven controlled crystal oscillator comprising:
a substrate;
a heat-insulating adhesive mounted on the substrate;
a carrier extending in a horizontal direction, and mounted on the heat-insulating adhesive and connected to the substrate through conductive wires devoid of interfacing solder pads;
a base mounted on a top surface of said carrier; an integrated circuit (IC) chip mounted on said top surface of the carrier, said IC chip positionally located horizontally adjacent said base; a top of the base having a first cavity, said IC chip being connected to the carrier;
a crystal blank mounted in the first cavity;
a first cover lid, mounted on the top of the base, sealing the first cavity;
a said heater connected to an element selected from the group of: the base, the carrier, and the IC chip; and
a second cover lid, mounted on a top of the substrate, covering the base, the carrier, the conductive wires, the crystal blank, the first cover lid, the IC chip, the heat-insulating adhesive, and the heater.

15. The oven controlled crystal oscillator according to claim 14, wherein the heater is embedded in the base.

16. The oven controlled crystal oscillator according to claim 14, wherein the heater is mounted on the IC chip.

17. The oven controlled crystal oscillator according to claim 14, wherein the heater is embedded in the carrier.

18. The oven controlled crystal oscillator according to claim 14, further comprising a temperature sensor mounted on the IC chip.

19. The oven controlled crystal oscillator according to claim 14, wherein the first cover lid and the second cover lid are metal lids.

20. The oven controlled crystal oscillator according to claim 14, wherein the substrate is a ceramic substrate, the carrier is a ceramic carrier, and the base is a ceramic base.

21. The oven controlled crystal oscillator according to claim 14, wherein the top of the substrate is provided with a second cavity, the base, the carrier, the conductive wires, the crystal blank, the first cover lid, the IC chip, the heat-insulating adhesive, and the heater are mounted in the second cavity, and the second cover lid seals the second cavity.

22. An oven controlled crystal oscillator comprising:
a substrate with a top provided with a first cavity;
a heat-insulating adhesive mounted in the first cavity;
a base mounted on the heat-insulating adhesive, mounted in the first cavity, and connected to the substrate through conductive wires devoid of interfacing solder pads, and a top of the base is provided with a second cavity;
a heater embedded in the base;
a crystal blank mounted in the second cavity,
an integrated circuit (IC) chip mounted in the second cavity, said IC chip positionally located adjacent said crystal blank and said heater, said IC chip being connected to the base;
a first cover lid, mounted on the top of the base, sealing the second cavity; and
a second cover lid, mounted on the top of the substrate, covering the base, the conductive wires, the crystal blank, the first cover lid, the IC chip, the heat-insulating adhesive, and the heater.

23. The oven controlled crystal oscillator according to claim 22, further comprising a temperature sensor mounted on the IC chip and accommodated in the second cavity.

24. The oven controlled crystal oscillator according to claim 22, wherein the first cover lid and the second cover lid are metal lids.

25. The oven controlled crystal oscillator according to claim 22, wherein the substrate is a ceramic substrate and the base is a ceramic base.

* * * * *